(12) United States Patent
Yamazaki et al.

(10) Patent No.: US 9,373,711 B2
(45) Date of Patent: Jun. 21, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hideomi Suzawa, Atsugi (JP); Akihisa Shimomura, Atsugi (JP); Tetsuhiro Tanaka, Isehara (JP); Sachiaki Tezuka, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 14 days.

(21) Appl. No.: 14/174,438

(22) Filed: Feb. 6, 2014

(65) Prior Publication Data

US 2014/0239293 A1 Aug. 28, 2014

(30) Foreign Application Priority Data

Feb. 27, 2013 (JP) .................................. 2013-037673

(51) Int. Cl.
*H01L 29/49* (2006.01)
*H01L 29/78* (2006.01)
(Continued)

(52) U.S. Cl.
CPC .............. *H01L 29/78* (2013.01); *H01L 29/105* (2013.01); *H01L 29/26* (2013.01); *H01L 29/7869* (2013.01); *H01L 29/78693* (2013.01); *H01L 29/78696* (2013.01)

(58) Field of Classification Search
CPC .................................. H01L 29/78; H01L 29/26
See application file for complete search history.

(56) References Cited

U.S. PATENT DOCUMENTS 5,648,663 A * 7/1997 Kitahara et al. ................ 257/59
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Nakayama et al., "17a-TL-8 Effect of GaO Layer on IGZO-TFT Channel," Extended Abstracts (The 57th Spring Meeting 2010), The Japan Society of Applied Physics and Related Societies, Mar. 17, 2010, pp. 21-008

(Continued)

*Primary Examiner* — Michael Shingleton
(74) *Attorney, Agent, or Firm* — Robinson Intellectual Property Law Office; Eric J. Robinson

(57) ABSTRACT

Disclosed is a semiconductor device including two oxide semiconductor layers, where one of the oxide semiconductor layers has an n-doped region while the other of the oxide semiconductor layers is substantially i-type. The semiconductor device includes the two oxide semiconductor layers sandwiched between a pair of oxide layers which have a common element included in any of the two oxide semiconductor layers. A double-well structure is formed in a region including the two oxide semiconductor layers and the pair of oxide layers, leading to the formation of a channel formation region in the n-doped region. This structure allows the channel formation region to be surrounded by an i-type oxide semiconductor, which contributes to the production of a semiconductor device that is capable of feeding enormous current.

37 Claims, 20 Drawing Sheets

(51) Int. Cl.
*H01L 29/26* (2006.01)
*H01L 29/786* (2006.01)
*H01L 29/10* (2006.01)

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 7,994,500 | B2 | 8/2011 | Kim et al. |
| 8,058,645 | B2 * | 11/2011 | Jeong et al. ............... 257/43 |
| 8,148,779 | B2 | 4/2012 | Jeong et al. |
| 8,188,480 | B2 | 5/2012 | Itai |
| 8,202,365 | B2 | 6/2012 | Umeda et al. |
| 8,203,143 | B2 | 6/2012 | Imai |
| 8,344,788 | B2 | 1/2013 | Yamazaki et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0051938 | A1 * | 3/2010 | Hayashi et al. ............... 257/43 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2010/0320458 | A1 | 12/2010 | Umeda et al. |
| 2010/0320459 | A1 | 12/2010 | Umeda et al. |
| 2011/0068852 | A1 | 3/2011 | Yamazaki et al. |
| 2011/0147740 | A1 * | 6/2011 | Jeong et al. ............... 257/43 |
| 2011/0193083 | A1 | 8/2011 | Kim et al. |
| 2011/0215328 | A1 | 9/2011 | Morosawa et al. |
| 2012/0119205 | A1 | 5/2012 | Taniguchi et al. |
| 2013/0119378 | A1 | 5/2013 | Yamazaki et al. |
| 2014/0225104 | A1 | 8/2014 | Yamazaki et al. |
| 2014/0239294 | A1 | 8/2014 | Yamazaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-231613 | 10/2009 |
| JP | 2010-016347 | 1/2010 |
| JP | 4415062 | 2/2010 |
| JP | 2010-067954 | 3/2010 |
| JP | 2010-177431 | 8/2010 |
| JP | 4571221 | 10/2010 |
| JP | 2011-091382 | 5/2011 |
| JP | 2011-172217 | 9/2011 |

(56) References Cited

FOREIGN PATENT DOCUMENTS

| JP | 2012-160679 | 8/2012 |
|---|---|---|
| WO | WO-2004/114391 | 12/2004 |
| WO | WO2008/133345 | 11/2008 |

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed by using single-crystalline $InGaO_3(ZnO)_5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

(56) References Cited

OTHER PUBLICATIONS

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 100° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

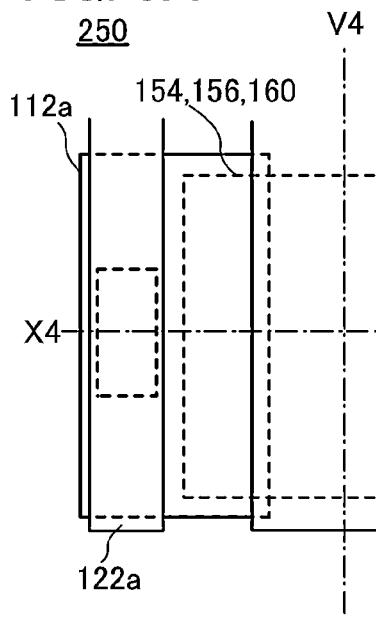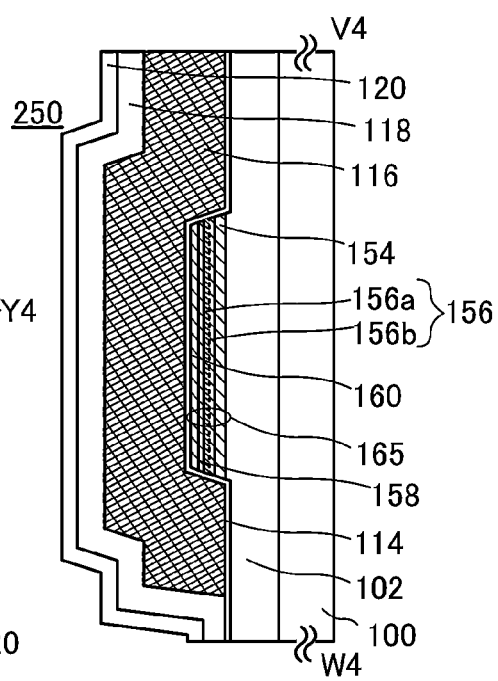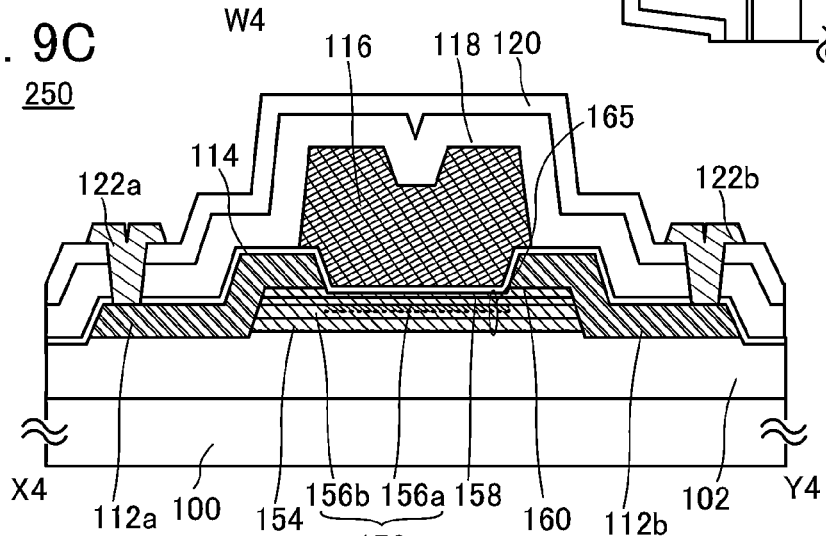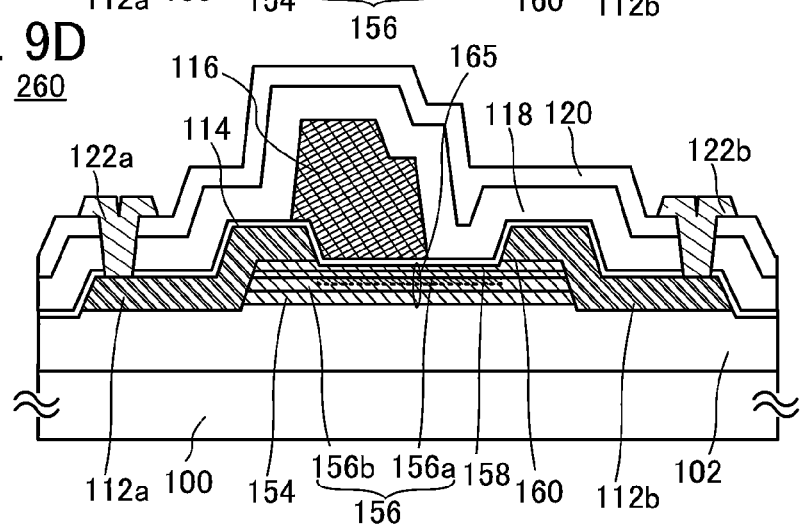

CAAC-OS film

Microcrystalline oxide semiconductor film

SEMICONDUCTOR DEVICE

BACKGROUND OF THE INVENTION

1. Field of the Invention

An embodiment of the present invention relates to a semiconductor device, a light-emitting device, a power storage device, a driving method thereof, or a manufacturing method thereof.

In this specification, a semiconductor device generally means a device that can function by utilizing semiconductor characteristics. For example, a semiconductor element such as a transistor; a power device; an integrated circuit, a power supply circuit, or a power supply converter circuit each including a power device; an electro-optical device; a semiconductor circuit; and an electronic appliance may be included in a category of a semiconductor device or may include a semiconductor device.

2. Description of the Related Art

As a semiconductor device used for a power device, a power device manufactured with the use of silicon is widely prevalent. However, the performance of a power device including silicon is reaching its limit, and it is becoming difficult to achieve higher performance.

In addition, silicon has a narrow band gap and thus there is a limit on the temperature range of operation of power devices using silicon. Thus, in recent years, power devices including SiC or GaN, which has a wide band gap, have been developed.

Patent Documents 1 and 2 disclose the use of an oxide semiconductor for a semiconductor device that is used as a power device for high-power application.

REFERENCE

[Patent Document 1] Japanese Published Patent Application No. 2011-91382

[Patent Document 2] Japanese Published Patent Application No. 2011-172217

SUMMARY OF THE INVENTION

It is an object of one embodiment of the present invention to provide a semiconductor device including an oxide semiconductor that can be applied to high power devices. An object of one embodiment of the present invention is to provide a semiconductor device capable of feeding a large current. A still further object of one embodiment of the present invention is to provide a highly reliable semiconductor device.

Note that the descriptions of these objects do not disturb the existence of other objects. Note that one embodiment of the present invention does not necessarily achieve all the objects describe above. Other objects will be apparent from and can be derived from the description of the specification, the drawings, and the claims.

In accordance with one embodiment of the present invention, a semiconductor device having a large on-state current is achieved by using an oxide semiconductor layer including an n-type region for a main current path (a channel formation region). In addition, a pinch-off operation is feasible by forming an oxide semiconductor layer including an i-type region between the oxide semiconductor layer including an n-type region and a source electrode layer. Alternatively, a semiconductor device of one embodiment of the present invention includes a structure in which an i-type oxide semiconductor layer is formed to surround an oxide semiconductor layer serving as a channel formation region and having an n-type region in a cross-sectional view in the channel length direction. Specifically, the structures described next can be employed for example.

One embodiment of the present invention is a semiconductor device including: a first oxide semiconductor layer including a first region containing an impurity imparting n-type conductivity; a second oxide semiconductor layer in contact with at least a part of the first region; a first oxide layer in contact with a lower surface of the first oxide semiconductor layer; a second oxide layer in contact with an upper surface of the second oxide semiconductor layer; a gate electrode layer overlapping with the first region; a gate insulating layer between the first oxide semiconductor layer and the gate electrode layer; and a source electrode layer and a drain electrode layer electrically connected to the first oxide semiconductor layer, where: the first oxide layer contains at least one of metal elements contained in the first oxide semiconductor layer; the second oxide layer contains at least one of metal elements contained in the second oxide semiconductor layer; and the second oxide semiconductor layer covers a top surface and a side surface of the first oxide semiconductor layer.

One embodiment of the present invention is a semiconductor device including: a first oxide semiconductor layer including a first region containing an impurity imparting n-type conductivity and a second region including an i-type oxide semiconductor layer; a second oxide semiconductor layer in contact with at least a part of the first region; a first oxide layer in contact with at least a part of the second region and under the first oxide semiconductor layer; a second oxide layer in contact with an upper surface of the second oxide semiconductor layer; a gate electrode layer overlapping with the first region; a gate insulating layer between the first oxide semiconductor layer and the gate electrode layer; and a source electrode layer and a drain electrode layer electrically connected to the first oxide semiconductor layer. In the semiconductor device, the first oxide layer contains at least one of metal elements contained in the first oxide semiconductor layer, the second oxide layer contains at least one of metal elements contained in the second oxide semiconductor layer, and the second oxide semiconductor layer covers a top surface and a side surface of the first oxide semiconductor layer.

In the semiconductor divide, the source electrode layer and the drain electrode layer may be in contact with and over the second oxide layer. Alternatively, the source electrode layer and the drain electrode layer may be in contact with and over the second oxide semiconductor layer, and the second oxide layer may be formed over the source electrode layer and the drain electrode layer.

Furthermore, in the semiconductor device, at least a part of the first region may be overlapped with the source electrode layer and the drain electrode layer. Alternatively, one end portion of the first region may coincide with one end portion of the source electrode layer and the other end portion of the first region may coincide with one end portion of the drain electrode layer in a cross section in a channel length direction.

Moreover, in the semiconductor device, the gate electrode layer may have a region overlapping with the source electrode layer and may not have a region overlapping with the drain electrode layer.

In accordance with one embodiment of the present invention, a semiconductor device which includes an oxide semiconductor and can be applied to high-power devices can be provided. Alternatively, in accordance with one embodiment of the present invention, a semiconductor device that can feed a large current can be provided. Alternatively, in accordance with one embodiment of the present invention, a semiconductor device with high reliability can be provided.

BRIEF DESCRIPTION OF THE DRAWINGS

FIGS. 9A to 9D are a plan view and cross-sectional views illustrating one embodiment of a semiconductor device.

DETAILED DESCRIPTION OF THE INVENTION

Figure 1A:
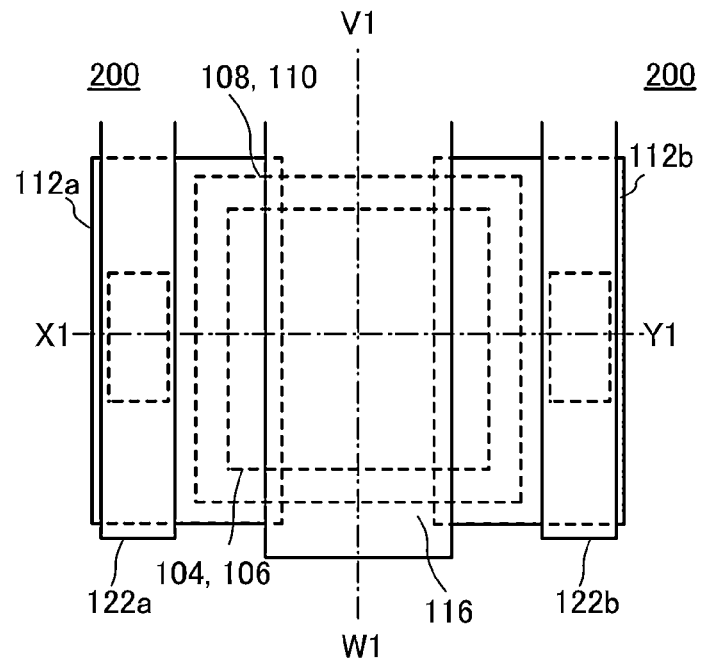
FIGS. 1A to 1C are a plan view and cross-sectional views illustrating one embodiment of a semiconductor device.

Embodiments of the present invention will be described below in detail with reference to the drawings. Note that the present invention is not limited to the following description, and it is easily understood by those skilled in the art that modes and details of the present invention can be modified in various ways. Accordingly, the present invention should not be interpreted as being limited to the content of the embodiments below.

Note that in the structures of the present invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the film thickness, or the region of each component may be exaggerated for clarity. Therefore, embodiments of the present invention are not limited to such a scale.

Note that the ordinal numbers such as "first" and "second" in this specification or the claims are used for convenience and do not indicate the order of steps or the stacking order of layers. In addition, the ordinal numbers do not denote particular names that specify the present invention.

Embodiment 1

In this embodiment, one embodiment of a semiconductor device and a method for manufacturing the semiconductor device will be described with reference to FIGS. 1A to 1C, FIGS. 2A and 2B, FIGS. 3A to 3E, FIGS. 4A to 4D, FIG. 5, FIGS. 6A to 6C, FIGS. 7A to 7D, and FIGS. 8A to 8D.

<Structural Example 1 of Semiconductor Device>

Figure 1B:
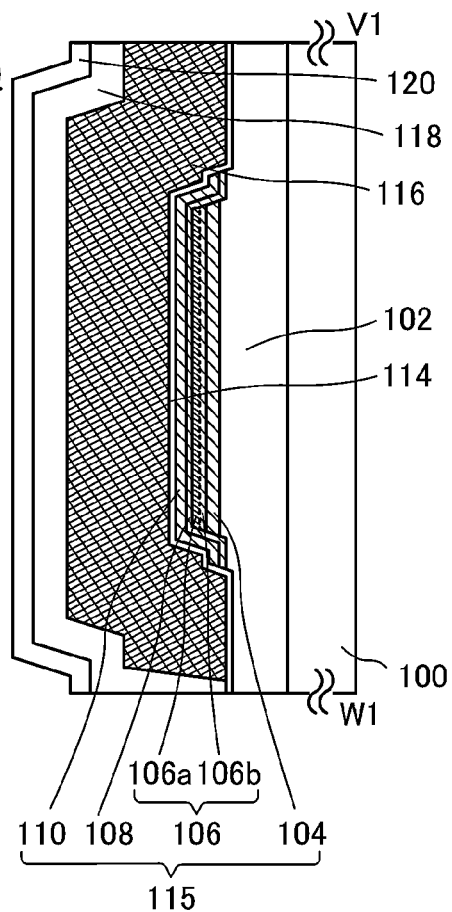
Figure 1C:
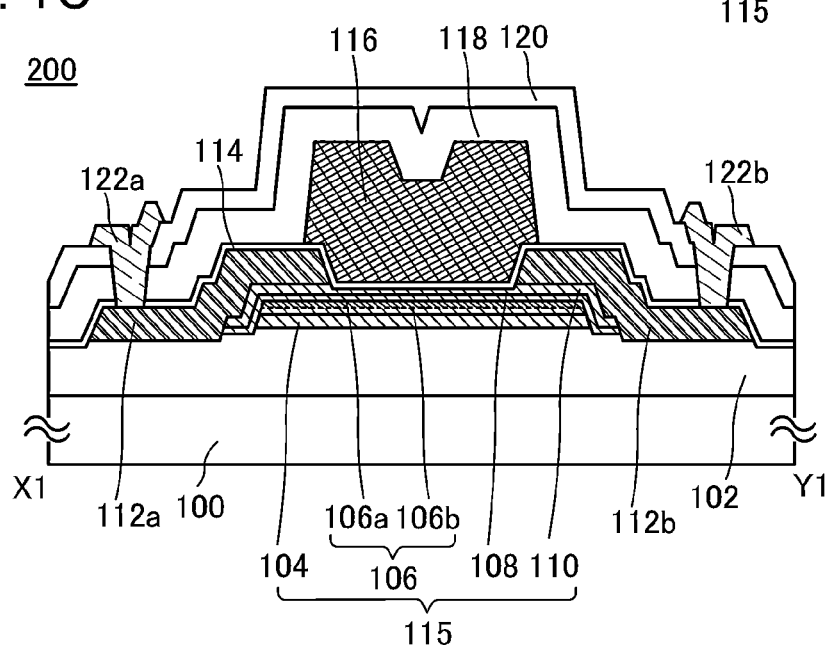

FIGS. 1A to 1C illustrate a structure example of a transistor 200. FIG. 1A is a plan view of the transistor 200, FIG. 1B is a cross-sectional view taken along the line V1-W1 in FIG. 1A, and FIG. 1C is a cross-sectional view taken along the line X1-Y1 in FIG. 1A.

The transistor 200 illustrated in FIGS. 1A to 1C includes a base insulating layer 102 formed over a substrate 100 having an insulating surface; a first oxide layer 104 over the base insulating layer 102; a first oxide semiconductor layer 106 over the first oxide layer 104; a second oxide semiconductor layer 108 covering a top surface and a side surface of the first oxide semiconductor layer 106; a second oxide layer 110 over the second oxide semiconductor layer 108; a source electrode layer 112a and a drain electrode layer 112b over the second oxide layer 110; a gate insulating layer 114 over the second oxide layer 110; and a gate electrode layer 116 overlapping with the first oxide semiconductor layer 106 with the gate insulating layer 114 interposed therebetween. In addition, the transistor 200 may include an insulating layer 118 and an insulating layer 120 over the gate electrode layer 116 as components. Furthermore, the transistor 200 may include an electrode layer 122a and an electrode layer 122b electrically connected to the source electrode layer 112a and the drain electrode layer 112b through contact holes formed in the gate insulating layer 114, the insulating layer 118, and the insulating layer 120.

The components of the transistor 200 will be described in detail below.

<Substrate>

The substrate 100 is not limited to a simple supporting member, and may be a substrate where a device such as a transistor is provided. In that case, at least one of the gate electrode layer 116, the source electrode layer 112a, the drain electrode layer 112b, the electrode layer 122a, and the electrode layer 122b of the transistor 200 may be electrically connected to the device provided to the substrate.

<Base Insulating Layer>

The base insulating layer 102 has a function of preventing diffusion of impurities from the substrate 100, and further a function of supplying oxygen to the first oxide layer 104, the first oxide semiconductor layer 106, the second oxide semiconductor layer 108, and/or the second oxide layer 110. Therefore, an insulating layer containing oxygen is used for the base insulating layer 102. Because oxygen is supplied from the base insulating layer 102, the oxygen vacancies in the first oxide semiconductor layer 106 and the second oxide semiconductor layer 108 can be reduced. Note that in the case where the substrate 100 is a substrate where another device is provided, the base insulating layer 102 serves as an interlayer insulating film. In that case, the base insulating layer 102 is preferably subjected to planarization treatment such as chemical mechanical polishing (CMP) treatment so as to have a flat surface.

In the transistor 200 in this embodiment, the base insulating layer 102 containing oxygen is formed under a stacked structure including the first oxide semiconductor layer 106 where a channel formation region is formed. With such a structure, oxygen in the base insulating layer 102 can be supplied to a channel formation region. The base insulating layer 102 preferably has a region containing oxygen in excess of the stoichiometric composition. When the base insulating layer 102 contains oxygen in excess of the stoichiometric composition, supply of oxygen to the channel formation region can be promoted.

Note that in this specification and the claims, the term "excess oxygen" means oxygen that can be transferred in an oxide semiconductor layer, silicon oxide, or silicon oxynitride by heat treatment or oxygen that exists in excess of the intrinsic stoichiometric composition.

<First and Second Oxide Layers and First and Second Oxide Semiconductor Layers>

The transistor 200 includes a stacked structure where the first oxide layer 104, the first oxide semiconductor layer 106, the second oxide semiconductor layer 108, and the second oxide layer 110 are formed between the base insulating layer 102 and the gate insulating layer 114 (hereinafter this structure is also referred to as an oxide stack 115).

The first oxide semiconductor layer 106 and the second oxide semiconductor layer 108 preferably contain indium (In) or zinc (Zn). Alternatively, both In and Zn are preferably contained. In order to reduce the fluctuations in electrical characteristics of the transistors including the oxide semiconductor layer, the oxide semiconductor layer preferably contains a stabilizer in addition to indium and zinc.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

Examples of the oxide semiconductor include indium oxide, tin oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide, Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, an In—Sn—Al—Zn oxide, In—Sn—Hf—Zn oxide, and In—Hf—Al—Zn oxide.

Note that the first oxide semiconductor layer 106 and the second oxide semiconductor layer 108 preferably have the same constituent elements, and further preferably, their compositions are identical. When the compositions of the first oxide semiconductor layer 106 and the second oxide semiconductor layer 108 are identical, the energies at the bottom of the conduction bands can be as close to each other as possible. As a result, the current path is not limited to be formed in only one of the first oxide semiconductor layer 106 and the second oxide semiconductor layer 108, and both of the layers can be used as a main current path. As a result, the series resistance between the source and the drain of the transistor can be reduced.

In this embodiment, as the first oxide semiconductor layer 106 and the second oxide semiconductor layer 108, oxide semiconductors represented by In-M-Zn oxides containing at least indium, zinc, and M (M is a metal of Al, Ga, Ge, Y, Zr, Sn, La, Ce, Hf, or the like) are used.

For the first oxide layer 104 in contact with the lower surface of the first oxide semiconductor layer 106, and the second oxide layer 110 in contact with the upper surface of the second oxide semiconductor layer 108, oxide layers mainly containing an element other than an element (e.g., silicon) serving as an impurity in the oxide semiconductor layers. For example, for the first oxide layer 104, an oxide layer containing at least one of metal elements included in the first oxide semiconductor layer 106 is used. In addition, for the second oxide layer 110, an oxide layer containing at least one of metal elements included in the second oxide semiconductor layer 108 is used.

As the first oxide layer 104, an oxide layer that is represented by an In-M-Zn-based oxide (M is a metal such as Al, Ti, Ga, Ge, Y, Zr, Sn, La, Ce, or Hf) and contains a larger atomic ratio of M than that in the first oxide semiconductor layer 106 is used in this embodiment. Specifically, the atomic ratio of the element M in the first oxide layer 104 is 1.5 times or more, preferably twice or more, more preferably three times or more as much as that in the first oxide semiconductor layer 106. The element M is more strongly bonded to oxygen than indium is, and thus has a function of suppressing generation of an oxygen vacancy in the oxide layer. That is, an oxygen vacancy is more unlikely to be generated in the first oxide layer 104 than in the first oxide semiconductor layer 106. In addition, as the proportion of the element M to indium or zinc is higher, the oxide has a larger energy gap. Thus, the first oxide layer 104 is an oxide layer having a larger band gap than that of the first oxide semiconductor layer 106.

As the second oxide layer 110, an oxide layer that is represented by an In-M-Zn-based oxide (M is a metal such as Al, Ti, Ga, Ge, Y, Zr, Sn, La, Ce, or Hf) and contains a larger atomic ratio of M than that in the second oxide semiconductor layer 108 is used. Specifically, the atomic ratio of the element M in the second oxide layer 110 is 1.5 times or more, preferably 2 times or more, more preferably 3 times or more as much as that in the second oxide semiconductor layer 108. Thus, an oxygen vacancy is more unlikely to be generated in the second oxide layer 110 than in the second oxide semiconductor layer 108, and the second oxide layer 110 is an oxide layer having a larger band gap than that of the second oxide semiconductor layer 108. In the transistor 200, the second oxide layer 110 is an oxide layer located between the first oxide semiconductor layer 106 serving as a channel formation region and the source electrode layer 112a and the drain electrode layer 112b, and thus, the atomic ratio of M is preferably adjusted such that a band gap allowing the second oxide layer 110 to exhibit semiconductor characteristics can be maintained. Note that the second oxide layer 110 may serve as a part of the gate insulating layer depending on the atomic ratio of M.

When each of the first oxide layer 104, the first oxide semiconductor layer 106, the second oxide semiconductor layer 108, and the second oxide layer 110 is an In-M-Zn oxide containing at least indium, zinc, and M (M is a metal element such as Al, Ti, Ga, Ge, Y, Zr, Sn, La, Ce, or Hf), and the first oxide layer 104 has an atomic ratio of In to M and Zn which is $x_1:y_1:z_1$, the first oxide semiconductor layer 106 and the second oxide semiconductor layer 108 each have an atomic ratio of In to M and Zn which is $x_2:y_2:z_2$, and the second oxide layer 110 has an atomic ratio of In to M and Zn which is $x_3:y_3:z_3$, each of $y_1/x_1$ and $y_3/x_3$ is preferably larger than $y_2/x_2$. Each of $y_1/x_1$ and $y_3/x_3$ is one and a half times or more as large as $y_2/x_2$, preferably twice or more as large as $y_2/x_2$, more preferably three times or more as large as $y_2/x_2$. At this time, when $y_2$ is greater than or equal to $x_2$ in the first oxide semiconductor layer 106 and the second oxide semiconductor layer 108, the transistor can have stable electrical characteristics. However, when $y_2$ is 3 times or more as large as $x_2$, the field-effect mobility of the transistor is reduced; accordingly, $y_2$ is preferably less than 3 times $x_2$.

In the case of using an In-M-Zn oxide for the first oxide layer 104, when Zn and oxygen are eliminated from consideration, the proportion of In and the proportion of M are preferably less than 50 atomic % and greater than or equal to 50 atomic %, respectively, further preferably less than 25 atomic % and greater than or equal to 75 atomic %, respectively. In the case of using In-M-Zn oxides for the first oxide semiconductor layer 106 and second oxide semiconductor layer 108, when Zn and oxygen are eliminated from consideration, the proportion of In and the proportion of M are preferably greater than or equal to 25 atomic % and less than 75 atomic %, respectively, further preferably greater than or equal to 34 atomic % and less than 66 atomic %, respectively. In the case of using an In-M-Zn oxide for the second oxide layer 110, when Zn and oxygen are eliminated from consideration, the proportion of In and the proportion of M are preferably less than 50 atomic % and greater than or equal to 50 atomic %, respectively, further preferably less than 25 atomic % and greater than or equal to 75 atomic %, respectively.

The constituent elements of the first oxide layer 104 and the second oxide layer 110 may be different from each other, or their constituent elements may be the same at the same atomic ratios or different atomic ratios.

For the first oxide layer 104, the first oxide semiconductor layer 106, the second oxide semiconductor layer 108, and the second oxide layer 110, for example, oxide semiconductors containing indium, zinc, and gallium can be used.

The thicknesses of the first oxide layer 104, the first oxide semiconductor layer 106, the second oxide semiconductor layer 108, and the second oxide layer 110 are preferably determined in accordance with electric characteristics (such as output current) required for the transistor 200. For example, the thickness of the second oxide layer 110 ranges from 3 nm to 500 nm, preferably from 3 nm to 100 nm, further preferably 3 nm to 50 nm. In addition, the thickness of each of the first oxide semiconductor layer 106 and the second oxide semiconductor layer 108 ranges from 3 nm to 500 nm, preferably from 3 nm to 200 nm, further preferably 3 nm to 100 nm, still further preferably 3 nm to 50 nm. In addition, the thickness of the first oxide layer 104 is preferably larger than or equal to the thickness of the second oxide layer 110, the first oxide semiconductor layer 106, or the second oxide semiconductor layer 108.

Preferably, the first oxide layer 104 contains one or more kinds of metal elements constituting the first oxide semiconductor layer 106, and is formed using an oxide semiconductor whose energy of the bottom of the conduction band is closer to the vacuum level than that of the first oxide semiconductor layer 106 by 0.05 eV or more, 0.07 eV or more, 0.1 eV or more, or 0.15 eV or more, or 0.15 eV or more and 2 eV or less, 1 eV or less, 0.5 eV or less, or 0.4 eV or less. Similarly, the second oxide layer 110 contains one or more kinds of metal elements constituting the second oxide semiconductor layer 108, and is preferably formed using an oxide semiconductor whose energy of the bottom of the conduction band is close to the vacuum level than that of the second oxide semiconductor layer 108 by 0.05 eV or more, 0.07 eV or more, 0.1 eV or more, or 0.15 eV or more and 2 eV or less, 1 eV or less, 0.5 eV or less, or 0.4 eV or less.

Here, the first oxide semiconductor layer 106 includes a first region 106a containing an impurity imparting an n-type conductivity. In the transistor 200, the first region 106a is formed in the entire region of the upper surface of the first oxide semiconductor layer 106 so as to overlap with the source electrode layer 112a, the drain electrode layer 112b, and the gate electrode layer 116. In addition, a part of the second oxide semiconductor layer 108 is formed in contact with the first region 106a.

Examples of the element imparting n-type conductivity contained in the first region 106a include carbon (C), phosphorus (P), arsenic (As), antimony (Sb), boron (B), aluminum (Al), nitrogen (N), argon (Ar), helium (He), neon (Ne), indium (In), fluorine (F), chlorine (CO, hydrogen (H), titanium (Ti), and zinc (Zn) in this specification.

Although a case is specifically described where the first region 106a with an increased conductivity is formed in the upper surface of the first oxide semiconductor layer 106, the first region 106a may be formed throughout in the thickness direction of the first oxide semiconductor layer 106 or an impurity imparting n-type conductivity may be contained in a part of the first oxide layer 104. Note that a second region 106b that is a region with a lower n-type impurity content, preferably a region containing an i-type or substantially i-type oxide semiconductor is preferably included between the first region 106a and the first oxide layer 104, in the first oxide semiconductor layer 106.

In this structure, when an electric field is applied to the gate electrode layer 116, a channel is formed in the first oxide semiconductor layer 106 and the second oxide semiconductor layer 108 (especially, in the first region 106a of the first oxide semiconductor layer 106) that have the lowest energies at the bottoms of the conduction bands in the stacked structure including the oxide semiconductor layers. In other words, the second oxide layer 110 is formed between the first oxide semiconductor layer 106 including the first region 106a and the gate insulating layer 114, whereby a structure in which the channel of the transistor 200 is not in contact with the gate insulating layer 114 can be obtained.

In addition, the oxide layers in which oxygen vacancies are less likely to be generated than in the first oxide semiconductor layer 106 are provided over and under and in contact with the first oxide semiconductor layer 106, whereby generation of oxygen vacancies in the channel of the transistor can be suppressed.

When the first region 106a containing the impurity imparting n-type conductivity is provided in the first oxide semiconductor layer 106, the series resistance between a source and a drain of the transistor 200 in an on state can be reduced. As a result, current flowing between the source and the drain in the on state (the current is also referred to as on-state current) can be increased.

As illustrated in FIG. 1C, the source electrode layer 112a and the first region 106a are overlapped with each other, and thus carriers are easily supplied to the first region 106a from the source electrode layer 112a through the second oxide layer 110 and the second oxide semiconductor layer 108, leading to an increase of on-state current.

To supply an impurity imparting n-type conductivity to the first oxide semiconductor layer 106, an ion implantation method, an ion doping method, a plasma immersion ion implantation method, or the like can be employed.

In the first region 106a, the concentration of the above element may have a continuous gradient in the thickness direction of the first oxide semiconductor layer 106.

The second oxide semiconductor layer 108 is formed in such a way that it is in contact with the first region 106a of the first oxide semiconductor layer 106 and covers the top surface and the side surfaces of the first oxide semiconductor layer 106 (see FIG. 1B and FIG. 1C). The second oxide semiconductor layer 108 preferably includes an i-type or substantially i-type oxide semiconductor. By forming the i-type or substantially i-type second oxide semiconductor layer 108 between the source electrode layer 112a and the first region 106a, on or off operations of the transistor 200 can be performed reliably. Furthermore, the transistor 200 can be normally off.

Here, the thickness of the second oxide semiconductor layer 108 is preferably adjusted such that the distance between the source electrode layer 112a and the first region 106a is large enough to preclude the contact. For example, in a region overlapping with the source electrode layer 112a, the thickness of the second oxide semiconductor layer 108 ranges from 10 nm to 40 nm, preferably from 20 nm to 40 nm, and thus the on or off operations of the transistor 200 can be performed reliably without on-state current loss. Furthermore, the transistor 200 can be normally off.

In addition, the second oxide semiconductor layer 108 is formed to cover the side surfaces and the top surface of the first oxide semiconductor layer 106, and thus the second oxide semiconductor layer 108 is located between the first region 106a and the drain electrode layer 112b, as well as between the first region 106a and the source electrode layer 112a. Because the first region 106a is not in direct contact with the source electrode layer 112a and the drain electrode layer 112b in this manner, the on-state current of the transistor 200 can be increased at the same time when the leakage current (also referred to as off-state current) between the source and the drain in an off state of the transistor 200 is decreased.

As illustrated in FIG. 1B, in the cross section in the channel width direction of the transistor 200, the side surfaces of the island-like first oxide semiconductor layer 106 is covered with the second oxide semiconductor layer 108, and the side surfaces of the second oxide semiconductor layer 108 is covered with the second oxide layer 110. This structure can reduce the influence of a parasitic channel that might be generated at the end portion in the channel width direction of the first oxide semiconductor layer 106 and/or the second oxide semiconductor layer 108. Therefore, the reliability of the transistor 200 can be improved.

The oxide semiconductor layer (the first oxide semiconductor layer 106 and the second oxide semiconductor layer 108) that contains oxygen sufficiently and is highly purified has a band gap of about 2.8 eV to 3.2 eV, has extremely few minority carriers having a density of about $1 \times 10^{-9}/cm^3$. Majority carriers come only from a source of the transistor. Accordingly, in the transistor using the oxide semiconductor layer, an avalanche breakdown does not occur.

Therefore, even when driving is performed at a high voltage such as several tens volts or several hundred volts, it is possible to secure an extremely large channel width with respect to the channel length in the transistor. As a result, the on-state current of the transistor can be increased. For example, even when the ratio of the channel width to the channel length (W/L) is greater than or equal to $10^3$, greater than or equal to $10^4$, or further, greater than or equal to $10^5$, favorable on/off operation can be achieved. For example, in the case of driving at a voltage less than or equal to 30 V, when the channel length is 3 μm, the channel width may fall within the range of 1 cm to 10 m, and for example, may be 80 cm.

Further, since an oxide semiconductor has a large band gap, the electrical characteristics of a transistor including an oxide semiconductor can have extremely small temperature dependence. For example, it is possible to realize a transistor that has small temperature dependence of the threshold voltage, on-state current, or off-state current as compared to a transistor using silicon as a semiconductor. Therefore, the transistor including an oxide semiconductor is suitable for high temperature operation.

<Source Electrode Layer and Drain Electrode Layer>

For the source electrode layer 112a and the drain electrode layer 112b, a conductive material that is easily bonded to oxygen can be used preferably. For example, Al, Cr, Cu, Ta, Ti, Mo, or W can be used. W (tungsten) having a high melting point is especially preferred because a relatively high process temperature can be employed in a later step. Note that a conductive material that easily reacts with oxygen includes a material where oxygen is easily diffused.

When such a conductive material that is easily bonded to oxygen is in contact with the oxide stack 115, oxygen in the oxide stack 115 is abstracted into the conductive material. There are some heating steps in a fabrication process of the transistor, and thus oxygen vacancies are generated in a region of the oxide stack 115 that is in the vicinity of an interface between the oxide stack 115 and the source electrode layer 112a or the drain electrode layer 112b, and thus an n-type region may be formed. The n-type region can function as the source or the drain of the transistor 200.

Note that a constituent element of the source electrode layer 112a and the drain electrode layer 112b may enter the n-type regions. Further, a region having high oxygen concentration may be formed in part of the source electrode layer 112a and part of the drain electrode layer 112b that are in contact with the n-type regions. A constituent element of the oxide stack 115 may enter the source electrode layer 112a and the drain electrode layer 112b in contact with the n-type regions in some cases.

In the above manner, the low-resistance region is formed in the region of the oxide stack 115 in contact with the source electrode layer 112a or the drain electrode layer 112b, whereby contact resistance between the oxide stack 115 and the source electrode layer 112a or the drain electrode layer 112b is reduced, so that parasitic resistance between the source and the drain in the transistor 200 can be reduced. As a result, the on-state current of the transistor 200 can be increased.

In a case of forming a transistor with an extremely short channel length, the n-type region that is formed by the generation of the oxygen vacancies sometimes extends in the channel length direction of the transistor. The extended n-type region in the channel length direction can be a cause of failures in electric characteristics of the transistor such as a threshold voltage shift or uncontrollable on-off switching (conduction state) with a gate voltage. Accordingly, when a transistor with an extremely short channel length is formed, it is preferable that the conductive material that is not easily bonded to oxygen be used for the source electrode and the drain electrode. As the conductive material, for example, tantalum nitride, titanium nitride, or the like is preferably used. Note that the conductive material that is not likely to be bonded to oxygen includes, in its category, a material to which oxygen is not easily diffused.

<Gate Insulating Layer>

The gate insulating layer 114 can be formed using a silicon oxide film, a gallium oxide film, an aluminum oxide film, a silicon nitride film, a silicon oxynitride film, an aluminum oxynitride film, a silicon nitride oxide film, or the like. The gate insulating layer 114 is preferably a film containing oxygen because it can supply oxygen to the second oxide layer 110, the second oxide semiconductor layer 108 and/or the first oxide semiconductor layer 106. In addition, as a material of the gate insulating layer 114, hafnium oxide, yttrium oxide, hafnium silicate ($HfSi_xO_y$, (x>0, y>0)), hafnium silicate to which nitrogen is added, hafnium aluminate ($HfAl_xO_y$, (x>0, y>0)), or lanthanum oxide may be used. The gate insulating layer 114 may be formed with either a single-layer structure or a stacked-layer structure.

<Gate Electrode Layer>

As a material of the gate electrode layer 116, a metal film containing an element selected from molybdenum, titanium, tantalum, tungsten, aluminum, copper, chromium, neodymium, and scandium; a metal nitride film containing any of the above elements as its component (a titanium nitride film, a molybdenum nitride film, or a tungsten nitride film); or the like can be used. Alternatively, a semiconductor film typified by a polycrystalline silicon film doped with an impurity element such as phosphorus, or a silicide film such as a nickel silicide film may be used as the gate electrode layer 116. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. Moreover, the gate electrode layer 116 can have a stacked structure of the above conductive material and the above metal material.

The gate electrode layer 116 can be formed to have a single-layer structure or a stacked-layer structure. As one layer of the gate electrode layer 116 that is in contact with the gate insulating layer 114, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. Such a film has a work function of higher than or equal to 5 eV, preferably higher than or equal to 5.5 eV, and the use of this film as the gate electrode layer enables the threshold voltage of the transistor to be shifted to a positive side. Accordingly, a normally-off switching element can be obtained.

<Band Structure of Stacked Layers in Transistor>

Band structures of the base insulating layer 102, the first oxide layer 104, the first oxide semiconductor layer 106, the second oxide semiconductor layer 108, the second oxide layer 110, and the gate insulating layer 114 in the transistor 200 will be described with reference to FIGS. 2A and 2B.

Figure 2A:
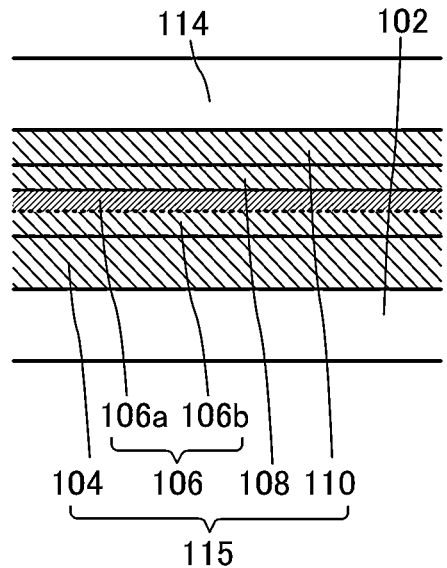
FIG. 2A is a diagram illustrating a stack structure included in a semiconductor device and FIG. 2B is a band diagram corresponding thereto.
Figure 2B:
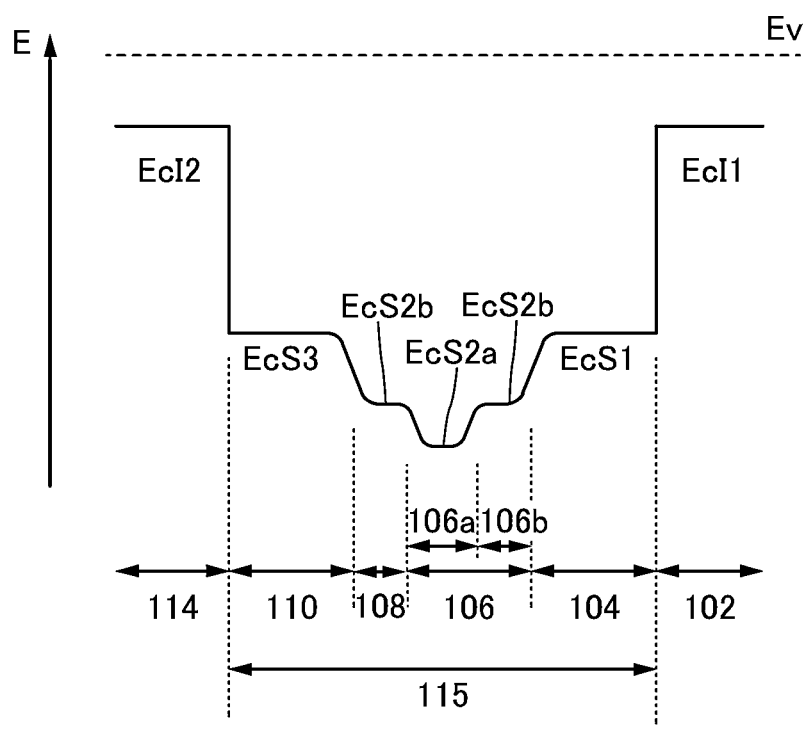

FIG. 2A is a schematic view of a part of the stacked structure including the oxide stack 115, and FIG. 2B schematically illustrates a part of the energy band structures of the stacked-layer structure in FIG. 2A.

In FIG. 2B, EcI1 schematically represents the energy of the bottom of the conduction band in the base insulating layer 102. Similarly, EcS1, EcS3, and EcI2 schematically represent the energies of the bottoms of the conduction bands in the first oxide layer 104, the second oxide layer 110, and the gate insulating layer 114, respectively. In addition, EcS2b represents the energies of the bottoms of the conduction bands of the second region 106b in the first oxide semiconductor layer 106 and the second oxide semiconductor layer 108, and EcS2a represents the energy of the bottom of the conduction band of the first region 106a in the first oxide semiconductor layer 106. EcS2a is a lower energy than EcS2b. Note that the thickness of each layer in FIG. 2A is not considered for convenience.

Note that although FIG. 2B shows the case where the first oxide layer 104 and the second oxide layer 110 are oxide layers having the same energy of the bottom of the conduction band, the first oxide layer 104 and the second oxide layer 110 may be oxide layers which differ in energy gap and energy of the bottom of the conduction band. Similarly, although the case where the first oxide semiconductor layer 106 and the second oxide semiconductor layer 108 are oxide semiconductor layers having the same energy of the bottom of the conduction band, the first oxide semiconductor layer 106 and the second oxide semiconductor layer 108 may differ in energy gap and energy of the bottom of the conduction band.

Here, an energy difference between the vacuum level and the bottom of the conduction band (the difference is also referred to as electron affinity) corresponds to a value obtained by subtracting an energy gap from an energy difference between the vacuum level and the top of the valence band (the difference is also referred to as an ionization potential). Note that the energy gap can be measured using a spectroscopic ellipsometer (UT-300 manufactured by HORIBA JOBIN YVON S.A.S., for example). The energy difference between the vacuum level and the top of the valence band can be measured using an ultraviolet photoelectron spectroscopy (UPS) device (VersaProbe manufactured by ULVAC-PHI, Inc., for example).

As illustrated in FIG. 2B, the energy of the bottom of the conduction band continuously changes between the first oxide layer 104 and the first oxide semiconductor layer 106 and between the second oxide semiconductor layer 108 and the second oxide layer 110 without any barrier between them. This is because oxygen is easily diffused between the first oxide layer 104 and the first oxide semiconductor layer 106, and between the second oxide semiconductor layer 108 and the second oxide layer 110 due to the similarity in composition, and thus a layer what is called a mixed layer is formed therebetween. In addition, the energy of the bottom of the conduction band continuously changes between the first region 106a and the second region 106b without any barrier between them. This is because the concentration of the element imparting n-type conductivity to the oxide semiconductor in the first region 106a changes continuously in the thickness direction.

The element contained in the first region 106a might be diffused into the second oxide semiconductor layer 108 by heat treatment after the formation of the second oxide semiconductor layer 108 or the like. In such a case, the concentration of the element continuously changes from the first region 106a toward the second oxide semiconductor layer 108. As a result, as illustrated in FIG. 2B, the energy of the bottom of the conduction band continuously changes also between the first region 106a and the second oxide semiconductor layer 108 without any barrier therebetween.

Accordingly to FIG. 2B, in the oxide stack 115, the first oxide semiconductor layer 106 and the second oxide semiconductor layer 108 each form a first well, and the first region 106a in the first oxide semiconductor layer 106 forms a second well in the first well. In other words, a buried channel is formed in the oxide stack 115, and a well is further formed in the buried channel. Such a structure having two-stage wells can also be referred to as a double well structure. The well provided in the first oxide semiconductor layer 106 allows a larger current to flow therethrough.

Further, the well formed by the first region 106a is apart from the interface between first oxide layer 104 and the base insulating layer 102 and the interface between the second oxide layer 110 and the gate insulating layer 114, and thus trap levels at the interfaces can be prevented from influencing the first region 106a serving as a main carrier path of the transistor.

To form the continuous junction illustrated in FIG. 2B, the layers are preferably stacked sequentially without exposure to the air using a deposition apparatus (sputtering apparatus) of a multi chamber type with a load lock chamber. It is preferable that each chamber of the sputtering apparatus be able to be evacuated to a high vacuum (to about $5 \times 10^{-7}$ Pa to $1 \times 10^{-4}$ Pa) by an adsorption vacuum pump such as a cryopump so that water and the like acting as impurities of the oxide semiconductor are removed as much as possible. Alternatively, a turbo molecular pump and a cold trap are preferably used in combination to prevent backflow of gas into the chamber through an evacuation system.

Not only high vacuum evacuation in a chamber but also a sputtering gas is highly purified to obtain a high-purity intrinsic oxide semiconductor. When an oxygen gas or an argon gas used as a sputtering gas is purified so as to have a dew point of −40° C. or lower, preferably −80° C. or lower, more preferably −100° C. or lower, moisture or the like can be prevented from entering an oxide semiconductor as much as possible.

The first oxide layer 104 provided under the first oxide semiconductor layer 106 and the second oxide layer 110 provided over the second oxide semiconductor layer 108 each serve as a barrier layer and can prevent a trap level formed at an interface between the oxide stack 115 and each of the insulating layers which are in contact with the oxide stack 115 (the base insulating layer 102 and the gate insulating layer 114) from adversely affecting the first region 106a of the first oxide semiconductor layer 106 that serves as a main carrier path for the transistor.

For example, oxygen vacancies contained in the oxide semiconductor layer exist as localized states at deep energy potential in the energy gap of the oxide semiconductor. A carrier is trapped in such localized states, and thereby the reliability of the transistor is lowered. For this reason, oxygen vacancies contained in the oxide semiconductor layer need to be reduced. In the transistor 200 in this embodiment, the first oxide layer 104 and the second oxide layer 110 in which oxygen vacancies are less likely to be generated than in the first oxide semiconductor layer 106 and the second oxide semiconductor layer 108 are provided to be in contact with the first oxide semiconductor layer 106 and the second oxide semiconductor layer 108, respectively, whereby oxygen vacancies in the first oxide semiconductor layer 106 and the second oxide semiconductor layer 108 can be reduced. For example, in the first oxide semiconductor layer 106, the absorption coefficient due to the localized levels, which is obtained by measurement by a constant photocurrent method (CPM) can be controlled to be lower than $1 \times 10^{-3}$/cm or lower than $1 \times 10^{-4}$/cm.

In addition, when the oxide semiconductor layer is in contact with an insulating layer including a different constituent element (e.g., a base insulating layer including a silicon oxide film), an interface state is sometimes formed at the interface of the two layers to form a channel. At this time, a second transistor having a different threshold voltage appears, so that an apparent threshold voltage of the transistor is varied. However, since the first oxide layer 104 contains one or more kinds of metal elements constituting the first oxide semiconductor layer 106 in the transistor 200 in this embodiment, an interface state is not easily formed at an interface between the first oxide layer 104 and the first oxide semiconductor layer 106. Thus, providing the first oxide layer 104 makes it possible to reduce fluctuations in the electrical characteristics of the transistor, such as a threshold voltage.

When a channel emerges at an interface between the gate insulating layer 114 and the second oxide semiconductor layer 108, interface scattering occurs at the interface and the field-effect mobility of the transistor is decreased. However, since the second oxide layer 110 contains one or more kinds of metal elements constituting the second oxide semiconductor layer 108 in the transistor 200 in this embodiment, scattering of carriers is less likely to occur at an interface between the second oxide layer 110 and the second oxide semiconductor layer 108, and thus the field-effect mobility of the transistor can be increased.

Further, the first oxide layer 104 and the second oxide layer 110 each also serve as a barrier layer that inhibits formation of an impurity level due to the entry of the constituent elements of the base insulating layer 102 and the gate insulating layer 114 into the oxide semiconductor layer (the first oxide semiconductor layer 106 or the second oxide semiconductor layer 108).

For example, in the case of using a silicon-containing insulating layer as the base insulating layer 102 or the gate insulating layer 114 that is in contact with the first oxide layer 104 or the second oxide layer 110, the silicon in the insulating layer or carbon that might be contained in the insulating layer enters the first oxide layer 104 or the second oxide layer 110 at a depth of several nanometers from the interface in some cases. When an impurity such as silicon or carbon enters the oxide semiconductor layer, an impurity state is formed and the impurity state serves as a factor of generating an electron, so that the oxide semiconductor layer may become n-type.

However, when the thickness of the first oxide layer 104 and the second oxide layer 110 is larger than several nanometers, the impurity such as silicon or carbon does not reach the oxide semiconductor layer, so that the influence of impurity levels is suppressed.

Note that the impurity concentrations of the oxide semiconductor layer can be measured by secondary ion mass spectrometry (SIMS), for example.

<Manufacturing Method of Semiconductor Device>

An example of a manufacturing method of the transistor 200 illustrated in FIGS. 1A to 1C is described with reference to FIGS. 3A to 3E and FIGS. 4A to 4D.

Figure 3A:
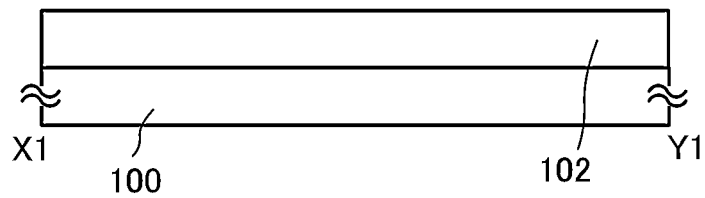
FIGS. 3A to 3E are cross-sectional views illustrating an example of a method for manufacturing a semiconductor device.

The base insulating layer 102 is formed first over the substrate 100 having an insulating surface (see FIG. 3A).

The base insulating layer 102 may have a single-layer structure or a stacked structure. Note that at least a region in the base insulating layer 102 that is in contact with the first oxide layer 104 formed later is formed of a material that contains oxygen in order to supply oxygen to the oxide stack 115 including the first oxide layer 104. Further, the base insulating layer 102 is preferably a film containing excess oxygen.

In order to make the base insulating layer 102 contain excess oxygen, the base insulating layer 102 may be formed in an oxide atmosphere, for example. Alternatively, oxygen is introduced into the base insulating layer 102 that has been formed to allow the base insulating layer 102 to contain excess oxygen. Both the methods may be combined.

The base insulating layer 102 is an insulating layer in contact with the first oxide layer 104 and thus it is preferable that the hydrogen concentration in the base insulating layer 102 be reduced. After the formation of the base insulating layer 102, it is preferable to perform heat treatment (dehydration treatment or dehydrogenation treatment) for the purpose of hydrogen removal.

The heat treatment is performed at a temperature of 250° C. to 650° C. inclusive, preferably 350° C. to 600° C. inclusive, or lower than the strain point of the substrate. For example, the substrate is put in an electric furnace that is one of heat treatment apparatuses, and the heat treatment is performed on the base insulating layer 102 at 450° C. in a vacuum (reduced-pressure) atmosphere for an hour.

Note that the heat treatment apparatus is not limited to an electric furnace, and an apparatus for heating an object by thermal conduction or thermal radiation from a heating element such as a resistance heating element may be used. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment in which an inert gas that does not react with an object to be processed, such as nitrogen or a rare gas such as argon, is heated at a high temperature. Note that in the case where a GRTA apparatus is used as the heat treatment apparatus, the substrate may be heated in an inert gas heated to high temperature of 650° C. to 700° C. because the heat treatment can be conducted in a short time.

The heat treatment may be performed in an atmosphere of nitrogen, oxygen, ultra-dry air (air in which the water content is 20 ppm or less, preferably 1 ppm or less, further preferably 10 ppb or less), or a rare gas (argon, helium, or the like). Note that it is preferable that water, hydrogen, or the like be not contained in the atmosphere of nitrogen, oxygen, ultra-dry air, or a rare gas. The purity of nitrogen, oxygen, or a rare gas which is introduced into a heat treatment apparatus is preferably 6N (99.9999%) or higher, more preferably 7N (99.99999%) or higher (that is, the impurity concentration is preferably 1 ppm or lower, more preferably 0.1 ppm or lower).

Note that oxygen can be released from the base insulating layer 102 by heat treatment. Accordingly, treatment for introducing oxygen (at least including any of oxygen radicals, ozone, oxygen atoms, and oxygen ions (including oxygen molecular ions and oxygen cluster ions)) to the dehydrated or dehydrogenated base insulating layer 102 is preferably performed.

The oxygen supply to the base insulating layer 102 can be performed by an ion implantation method, an ion doping method, a plasma ion immersion ion implantation method, plasma treatment, or the like, for example. A gas containing oxygen can be used for oxygen supply treatment. As a gas containing oxygen, oxygen, dinitrogen monoxide, nitrogen dioxide, or the like can be used. Further, a rare gas may be included in the gas containing oxygen for the oxygen supply treatment. By the oxygen supply treatment on the base insulating layer 102, oxygen that is released by heat treatment can be compensated.

Figure 3B:
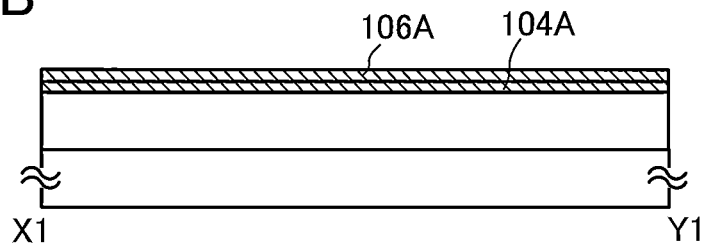

Next, a first oxide film 104A to serve as the first oxide layer 104 and an oxide semiconductor film 106A to serve as the first oxide semiconductor layer 106 are formed in this order over the base insulating layer 102 (see FIG. 3B). The first oxide film 104A and the first oxide semiconductor film 106A are formed by a sputtering method, a CVD method, a molecular beam epitaxy (MBE) method, an atomic layer deposition (ALD) method, or a pulsed laser deposition (PLD) method.

The first oxide film 104A and the first oxide semiconductor film 106A can be formed using the above-described materials.

For example, when the first oxide film 104A to serve as the first oxide layer 104 is formed by a sputtering method, a sputtering target with a composition of In:Ga:Zn=1:3:2 in atomic ratio, a sputtering target with a composition of In:Ga:Zn=1:6:4 in atomic ratio, a sputtering target with a composition of In:Ga:Zn=1:9:6 in atomic ratio, or a sputtering target having a composition that is close to the compositions of the above targets is preferably used.

For example, when the first oxide semiconductor film 106A to serve as the first oxide semiconductor layer 106 is formed by a sputtering method, a sputtering target with a composition of In:Ga:Zn=1:1:1 in atomic ratio, a sputtering target with a composition of In:Ga:Zn=3:1:2 in atomic ratio, or a sputtering target having a composition that is close to the compositions of the above targets is preferably used.

As described above, a material of the first oxide film 104A is selected such that the first oxide film 104A has a lower electron affinity than the oxide semiconductor film 106A.

Note that the composition of the film formed by a sputtering method may be different from the composition of the target for forming the film. For example, when an oxide semiconductor film is formed using a sputtering target including ZnO, sublimation of ZnO or the like may occur during deposition, so that the atomic ratio of Zn to In and/or Ga in the deposited oxide semiconductor film is lower than that of the sputtering target.

The first oxide semiconductor film 104A and the first oxide semiconductor film 106A are preferably formed by a sputtering method. As the sputtering method, an RF sputtering method, a DC sputtering method, an AC sputtering method, or the like can be used. In particular, a DC sputtering method is preferably used because dust generated in the deposition can be reduced and the film thickness can be uniform.

In the formation of the first oxide film 104A and the first oxide semiconductor film 106A, the hydrogen concentration in the films is preferably reduced as much as possible. To reduce the hydrogen concentration, for example, in the case where the films are formed by a sputtering method, oxygen, a high-purity rare gas (typically, argon) from which impurities such as hydrogen, water, a compound having a hydroxyl group, and a hydride have been removed, or a mixed gas of oxygen and a rare gas is used as appropriate as an atmosphere gas supplied to a deposition chamber of a sputtering apparatus.

The first oxide film and the oxide semiconductor film are formed in such a manner that a sputtering gas from which hydrogen and moisture are removed is introduced into a deposition chamber while moisture remaining in the deposition chamber is removed, whereby the concentration of hydrogen in the films can be reduced. In order to remove the residual moisture in the deposition chamber, an entrapment vacuum pump, for example, a cryopump, an ion pump, or a titanium sublimation pump is preferably used. The evacuation unit may be a turbo molecular pump provided with a cold trap. When the deposition chamber is evacuated with the cryopump, which has a high capability in removing a hydrogen molecule, a compound containing a hydrogen atom such as water ($H_2O$) (or a compound containing a carbon atom), and the like, the impurity concentration in the oxide film and the oxide semiconductor film formed in the deposition chamber can be reduced.

Note that oxygen may be supplied into the first oxide film 104A at timing which is after formation of the first oxide film 104A and before formation of the first oxide semiconductor film 106A. By the oxygen supply treatment, the first oxide film 104A excessively contains oxygen, so that the excess oxygen can be supplied to the first oxide semiconductor film 106A by heat treatment in a later film formation step.

After the formation of the first oxide film 104A and the first oxide semiconductor film 106A, heat treatment is preferably performed. The heat treatment may be performed at a heating temperature of 250 to 650° C., preferably 300 to 500° C., in an inert gas atmosphere, an atmosphere containing an oxidizing gas at 10 ppm or more, or a reduced pressure atmosphere. Alternatively, the heat treatment may be performed in such a manner that heat treatment is performed in an inert gas atmosphere, and then another heat treatment is performed in an atmosphere containing an oxidizing gas at 10 ppm or more in order to compensate released oxygen. By this heat treatment, impurities such as hydrogen or water can be removed from at least one of the base insulating layer 102, the first oxide film 104A, and the first oxide semiconductor film 106A Note that the above-described heat treatment may be performed after the first oxide film 104A and the first oxide semiconductor film 106A are processed into an island shape. However, it is preferred that the heat treatment for dehydration or dehydrogenation be performed before processing in order to exclude an opportunity of oxygen contained in the base insulating layer 102 to release from a region that is not covered with the island-shaped first oxide layer 104 and first oxide semiconductor layer 106.

Figure 3C:
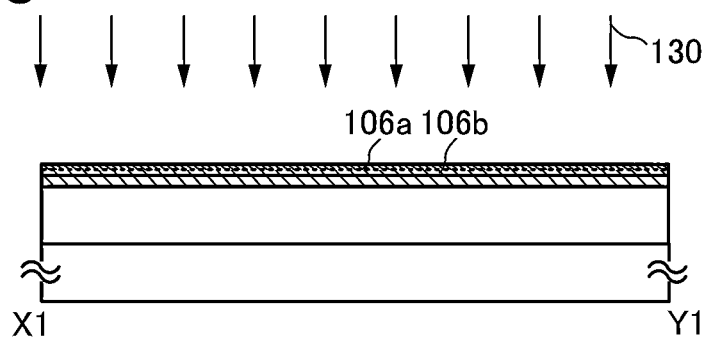

Next, the element 130 is supplied into the first oxide semiconductor film 106A to form the first region 106a (see FIG. 3C).

The element 130 can be an impurity that can impart n-type conductivity, for example, phosphorus (P). As the element 130, in addition to phosphorus (P), elements belonging to Group 15 (e.g., nitrogen (N), arsenic (As) and antimony (Sb)), boron (B), aluminum (Al), argon (Ar), helium (He), neon (Ne), indium (In), fluorine (F), chlorine (CO, hydrogen (H), titanium (Ti), or zinc (Zn) may be used.

The element 130 may be included in a state of a radical, an atom, a molecule, or an ion.

Examples of a method for supplying the element 130 to the first oxide semiconductor film 106A include an ion implantation method, an ion doping method, and a plasma immersion ion implantation method. Alternatively, heat treatment or plasma treatment in an atmosphere containing the element 130 may be used.

The conditions in the supply of the element 130 are preferably set so that the element 130 cannot reach the interface between the first oxide semiconductor film 106A and the first oxide film 104A. The element 130 is preferably supplied so that a region having the highest concentration of the element 130 is located in the vicinity of the surface of the first oxide semiconductor film 106A (for example, in a range from the surface to a thickness of 20 nm or less, preferably 10 nm or less, further preferably 5 nm or less). Alternatively, the element 130 is preferably supplied in such a manner that a region having the highest concentration of the element 130 is located in an area that is ¾ or less of the thickness of the first oxide semiconductor film 106A from the surface thereof, preferably ½ or less from the surface, further preferably ¼ or less from the surface.

By the supply of the element 130 in such a method, the first region 106a that is an n-type region and the second region 106b that has a lower concentration of the element 130 than that of the first region 106a can be formed in the first oxide semiconductor film 106A. The second region 106b is preferably i-type or substantially i-type.

Figure 3D:
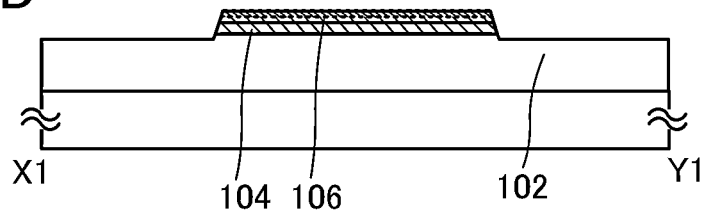

Then, the first oxide film 104A and the first oxide semiconductor film 106A are processed into the first oxide layer 104 and the first oxide semiconductor layer 106 that have an island-like shape (see FIG. 3D). Here, the first oxide layer 104A and the first oxide semiconductor layer 106A can be etched by using the same mask. Therefore, the plane shapes of the first oxide layer 104 and the first oxide semiconductor layer 106 are identical and the upper end of a side surface of the first oxide layer 104 coincides with the lower end of a side surface of the first oxide semiconductor layer 106. In other words, the side surface of the first oxide layer 104 and the side surface of the first oxide semiconductor layer 106 are coplanar.

In this specification and the claims, the term "the same" "identical" or "coincide" does not necessarily mean exactly being the same or exactly coinciding and include the meaning of being substantially the same, substantially identical or substantially coinciding. For example, shapes obtained by etching using the same mask are expressed as being the same or identical or coinciding with each other.

In processing into the first oxide layer 104 and the first oxide semiconductor layer 106, the first oxide film 104A may be over-etched, in which case part of the base insulating layer 102 (the region that is not covered with the island-shaped first oxide layer 104 and the island-shaped first oxide semiconductor layer 106) is etched to cause a reduction in film thickness of the base insulating layer 102.

Figure 3E:
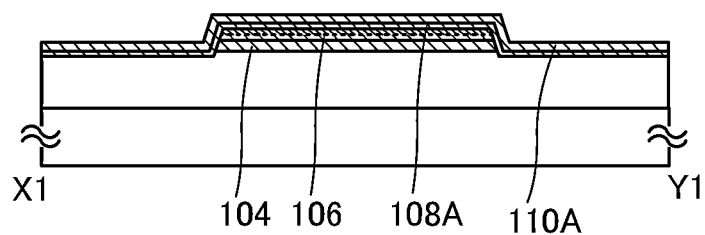

Next, a second oxide semiconductor film 108A and a second oxide layer 110A are formed in this order to cover the side surfaces and the top surface of the first oxide semiconductor layer 106 (FIG. 3E).

The second oxide semiconductor film 108A to serves as the second oxide semiconductor layer 108 and the second oxide layer 110A to serve as the second oxide layer 110 can be formed using any of the described-above materials. In addition, the formation method thereof can be the same as that of the first oxide film 104A or the first oxide semiconductor film 106A.

For example, when the second oxide semiconductor film 108A is formed by a sputtering method, the same sputtering target as the sputtering target used for the formation of the first oxide semiconductor film 106A is preferably used. In this case, a sputtering target containing indium, gallium, and zinc at an atomic ratio of 1:3:2, a sputtering target containing indium, gallium, and zinc at an atomic ratio of 1:6:4, a sputtering target containing indium, gallium, and zinc at an atomic ratio of 1:9:6, a sputtering target having a composition that is close to the compositions of the above targets is preferably used.

After the formation of the second oxide semiconductor film 108A and the second oxide layer 110A, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the heat treatment may be performed in such a manner that heat treatment is performed in an inert gas atmosphere, and then another heat treatment is performed in an atmosphere containing an oxidization gas at 10 ppm or more, in order to compensate desorbed oxygen. By the heat treatment, an impurity such as hydrogen or water can be removed from the base insulating layer 102, the first oxide layer 104, the first oxide semiconductor layer 106, the second oxide semiconductor film 108A, or the second oxide layer 110A. Further, by the heat treatment, oxygen can be supplied from the base insulating layer 102 to the oxide stack 115 formed over the base insulating layer 102.

The heat treatment may be performed at any timing as long as it is performed after the first oxide semiconductor film 106A is formed and may be performed repeatedly. For example, the heat treatment may be performed just after the formation of the first oxide semiconductor layer 106, just after the formation of the second oxide layer 110, or in a later step.

Figure 4A:
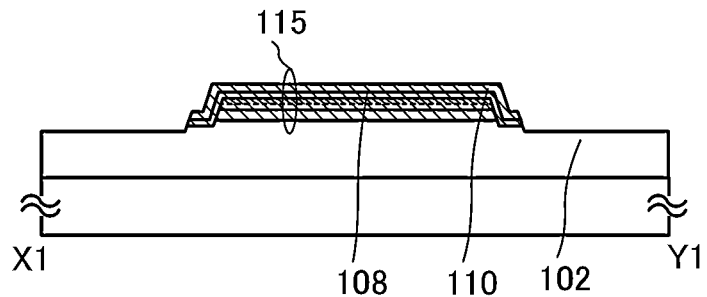
FIGS. 4A to 4D are cross-sectional views showing one example of a method for manufacturing a semiconductor device.

Then, the second oxide semiconductor film 108A and the second oxide layer 110A are processed by a photolithography process or the like, so that the second oxide semiconductor layer 108 and the second oxide layer 110 are formed (see FIG. 4A). Here, the second oxide semiconductor layer 108 and the second oxide layer 110 can be formed by etching using the same mask. Therefore, the plane shapes of the second semiconductor oxide layer 108 and the second oxide layer 110 are identical and the upper end of a side surface of the second oxide semiconductor layer 108 coincides with the lower end of a side surface of the second oxide layer 110.

By this etching process, the oxide stack 115 including the first oxide layer 104, the first oxide semiconductor layer 106, the second oxide semiconductor layer 108, and the second oxide layer 110 is formed.

In the processing into the second oxide semiconductor layer 108 and the second oxide layer 110, a part of the base insulating layer 102 (a region not covered with the island-like second oxide semiconductor layer 108 and the island-like second oxide layer 110) is etched and thinned by overetching of the second oxide semiconductor film 108A in some cases.

Figure 4B:
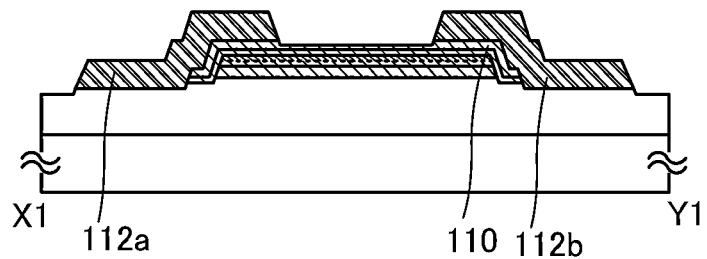

Then, a conductive film is formed over the second oxide layer 110 and is processed to form the source electrode layer 112a and the drain electrode layer 112b (FIG. 4B).

Note that the source electrode layer 112a and the drain electrode layer 112b may have shapes having some steps at their end portions in such a way that a step of making a resist mask recede by ashing and an etching step are alternately performed more than once. It is preferable that the number of steps be increased as the thickness of each of the source electrode layer 112a and the drain electrode layer 112b is larger. The end portions of the source electrode layer 112a and the drain electrode layer 112b are not necessarily symmetrical. In addition, a curved surface with a given curvature radius may be provided between the top surface and the side surface of each step.

When each of the source electrode layer 112a and the drain electrode layer 112b has a shape including a plurality of steps as described above, coverage with the films formed over the source electrode layer 112a and the drain electrode layer 112b, specifically, coverage with the gate insulating layer 114 and the like is improved, so that the transistor can have more improved electrical characteristics and reliability.

When the source electrode layer 112a and the drain electrode layer 112b are processed, a part of the base insulating layer 102 and a part of the second oxide layer 110 (regions not covered with the source electrode layer 112a and the drain electrode layer 112b) are etched due to overetching of the conductive film, thereby the thicknesses are reduced.

Note that if the conductive film to serve as the source electrode layer 112a and the drain electrode layer 112b remains over the oxide stack 115 as a residue, the residue may form an impurity state in the oxide stack 115 or at the interface thereof. Further, oxygen extraction from the oxide stack 115 may be caused by the residue to form an oxygen vacancy.

Therefore, treatment for removing the residue may be performed on the surface of the second oxide layer 110 after the source electrode layer 112a and the drain electrode layer 112b are formed. As the treatment for removing the residue, etching treatment (e.g., wet etching) or plasma treatment using oxygen or dinitrogen monoxide may be employed. The treatment for removing the residue may reduce the thickness of the second oxide layer 110 between the source electrode layer 112a and the drain electrode layer 112b by 1 nm or more and 3 nm or less.

Next, the gate insulating layer 114 is formed over the oxide stack 115, the source electrode layer 112a, and the drain electrode layer 112b.

The gate insulating layer 114 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Note that the gate insulating layer 114 may be a stacked film of any of the above materials. The gate insulating layer 114 can be formed by a sputtering method, a CVD method, an MBE method, an ALD method, a PLD method, or the like.

Like the base insulating layer 102 described above, the gate insulating layer 114 may have a function of supplying oxygen to the oxide stack 115, and is preferably formed using an insulating layer containing oxygen.

Heat treatment may be performed after the gate insulating layer 114 is formed. The heat treatment can be performed under the same conditions as those described above.

Figure 4C:
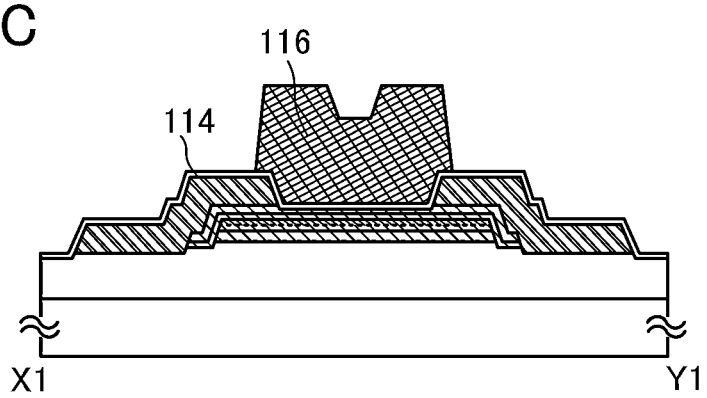

Then, a conductive film is formed over the gate insulating layer 114, and an unnecessary portion is etched so that the gate electrode layer 116 is formed (see FIG. 4C).

After the formation of the gate electrode layer 116, heat treatment may be performed. The heat treatment can be performed under conditions similar to those described above.

Then, the insulating layer 118 and the insulating layer 120 are stacked in this order over the gate insulating layer 114 and the gate electrode layer 116.

The insulating layer 118 and the insulating layer 120 can be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Note that the insulating layer 118 and the insulating layer 120 may be a stacked layer of any of the above materials. The insulating layer 118 and the insulating layer 120 can be formed by a sputtering method, a CVD method, an MBE method, an ALD method, a PLD method, or the like.

Further, the insulating layer 118 is preferably formed using a layer with a low oxygen permeability (or a layer with an oxygen bather property). Examples of a material for the layer with a low oxygen permeability include aluminum oxide, and nitrides such as silicon nitride, and silicon nitride oxide. By providing the insulating layer 118 with a low oxygen permeability to cover the gate insulating layer 114, oxygen that will be released from the base insulating layer 102 or the like by heat treatment performed later can be prevented from being released outside through the insulating layer 118 and the oxygen can be supplied to the oxide stack 115 effectively.

Alternatively, the insulating layer 118 may be a layer containing oxygen (containing excess oxygen) that can be a source of oxygen to the oxide stack 115, and the insulating layer 120 may be a layer with a low oxygen permeability. In this case, oxygen released from the insulating layer 118 by heat treatment is inhibited from being released outside through the insulating layer 120, so that the oxygen can efficiently supplied to the oxide stack 115.

After the formation of the insulating layer 118, or the formation of the insulating layer 118 and the insulating layer 120, heat treatment may be performed. The heat treatment can be performed under conditions similar to those described above. By the heat treatment, oxygen can be effectively supplied to the oxide stack 115 from the layer containing oxygen that surrounds the oxide stack 115, and thereby, the amount of oxygen vacancies in the first oxide semiconductor layer 106 and the second oxide semiconductor layer 108 can be reduced.

Then, the insulating layer 120 and the insulating layer 118 are selectively etched to form an opening portion reaching the source electrode layer 112a and an opening portion reaching the drain electrode layer 112b.

Figure 4D:
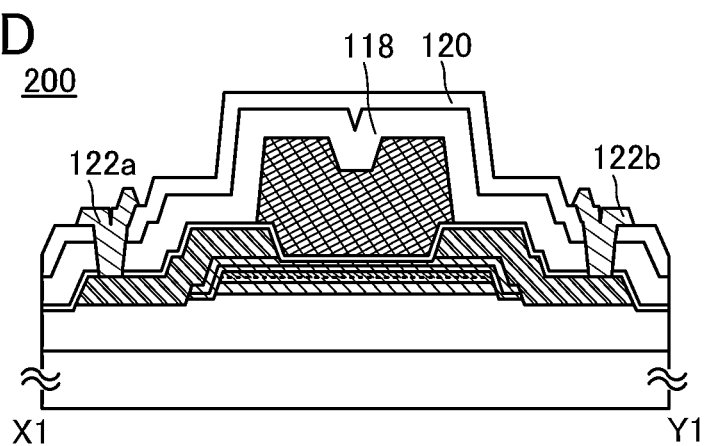

Then, a conductive film is formed over the insulating layer 120 and an unnecessary portion is removed by etching to form the electrode layer 122a electrically connected to the source electrode layer 112a and the electrode layer 122b electrically connected to the drain electrode layer 112b (see FIG. 4D).

As materials of the electrode layer 122a and the electrode layer 122b, materials that can be used for the source electrode layer 112a, the drain electrode layer 112b, or the gate electrode layer 116 can be used.

Through the above-described steps, the transistor 200 can be manufactured.

<Structure Example 2 of Semiconductor Device>

Figure 5:
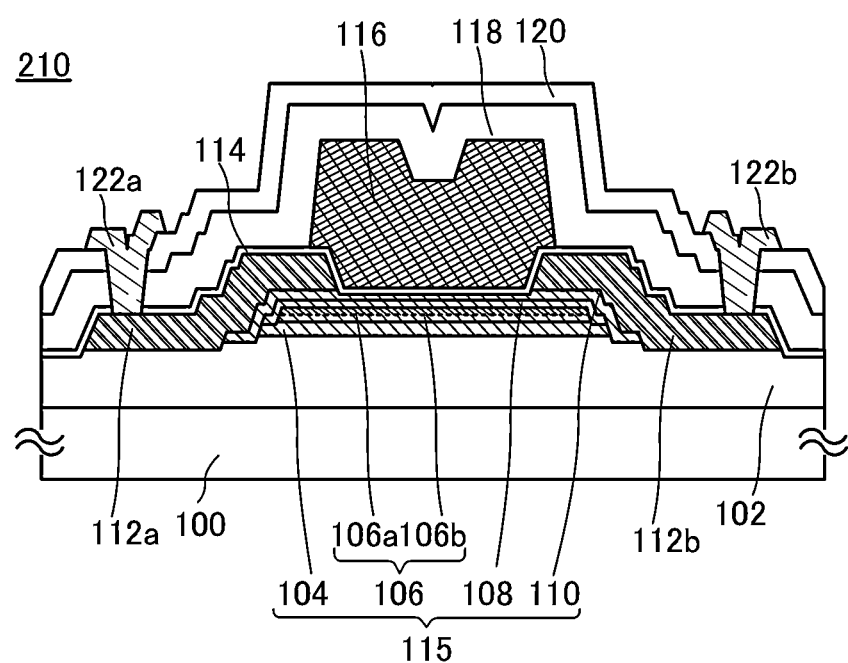
FIG. 5 is a cross-sectional view illustrating one embodiment of a semiconductor device.

FIG. 5 illustrates a structural example of a transistor 210. In the oxide stack 115 of the transistor 210 illustrated in FIG. 5, the second oxide semiconductor layer 108 is formed to be in contact with the top surface of the first oxide layer 104 that is not covered with the first oxide semiconductor layer 106 and the side surfaces and the top surface of the first oxide semiconductor layer 106. In this manner, an end portion of the second oxide semiconductor layer 108 is covered with the second oxide layer 110. In other words, a side surface of the second oxide semiconductor layer 108 is in contact with the second oxide layer 110. The other components of the transistor 210 are similar to those of the transistor 200; thus, detailed description thereof is omitted here.

The formation method of the oxide stack 115 included in the transistor 210 is described below. As in the steps in FIGS. 3A to 3C, the base insulating layer 102, the first oxide film 104A, and the first oxide semiconductor film 106A including the first region 106a and the second region 106b are formed first over the substrate 100.

Then, the first oxide semiconductor film 106A is processed by a photolithography process or the like to form the first oxide semiconductor layer 106 having an island-like shape over the first oxide film 104A. At this time, a preferable etching condition for the first oxide semiconductor film 106A is one that can give a sufficiently high etching selectivity with respect to the first oxide film 104A. If the composition of the first oxide film 104A is close to the composition of the first oxide semiconductor film 106A or a sufficiently high etching selectivity is not given, for example, the first oxide film 104A might be etched, leading to partial thinning of the first oxide film 104A.

Then, the second oxide semiconductor film 108A is formed over the first oxide film 104A to cover the first oxide semiconductor layer 106 having an island-like shape. The first oxide film 104A and the second oxide semiconductor film 108A are processed by a photolithography process or the like to form the first oxide layer 104 and the second oxide semiconductor layer 108. Here, the first oxide layer 104 and the second oxide semiconductor layer 108 can be formed by etching using the same mask. Therefore, the plane shapes of the first oxide layer 104 and the second oxide semiconductor layer 108 are identical and the upper end of a side surface of the first oxide layer 104 coincides with the lower end of a side surface of the second oxide semiconductor layer 108.

When the first oxide film 104A and the second oxide semiconductor film 108A are processed into the first oxide layer 104 and the second oxide semiconductor layer 108, a part (a region not covered with the first oxide layer 104 having an island-like shape and the second oxide semiconductor layer 108 having an island-like shape) of the base insulating layer 102 might be etched to be thinned because of overetching of the first oxide film 104A.

After that, the second oxide layer 110A is formed to cover the side surfaces of the first oxide layer 104 and the side surfaces and the top surface of the second oxide semiconductor layer 108, and processed by a photolithography process or the like to form the second oxide layer 110. Through the above steps, the oxide stack 115 included in the transistor 210 can be formed.

The oxide stack 115 formed in the above manner has a structure in which the first oxide semiconductor layer 106 is surrounded by the first oxide layer 104 and the second oxide semiconductor layer 108. In other words, at the end portion of the second oxide semiconductor layer 108, the second oxide semiconductor layer 108 is in contact with the first oxide layer 104, not with the base insulating layer 102. Thus, an impurity such as silicon can be further inhibited from entering the first oxide semiconductor layer 106. In addition, the side surfaces of the second oxide semiconductor layer 108 are covered with the second oxide layer 110; therefore, oxygen can be inhibited from being released from the side surfaces.

<Structural Example 3 of Semiconductor Device>

Figure 6A:
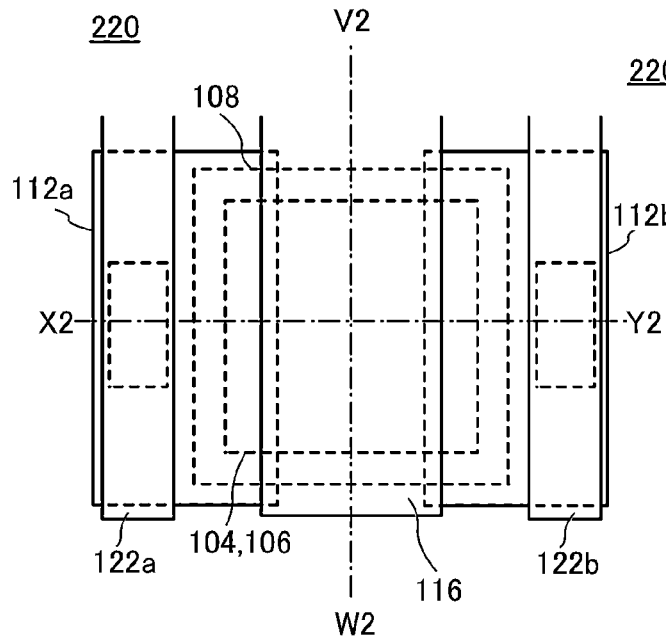
FIGS. 6A to 6C are a plan view and cross-sectional views illustrating one embodiment of a semiconductor device.
Figure 6B:
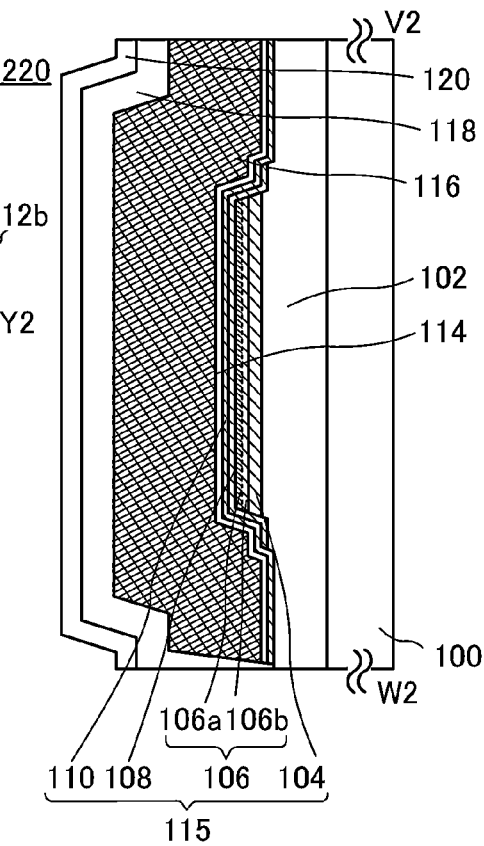
Figure 6C:
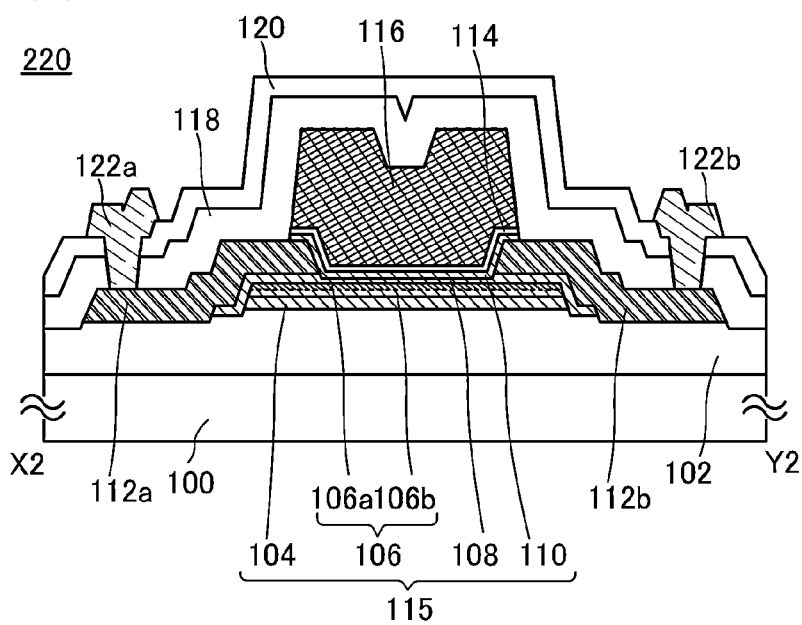

FIGS. 6A to 6C illustrate a structural example of a transistor 220. FIG. 6A is a plan view of the transistor 220, FIG. 6B is a cross-sectional view of the transistor 220 taken along the line V2-W2 in FIG. 6A and FIG. 6C is a cross-sectional view of the transistor 220 taken along the line X2-Y2 in FIG. 6A.

In the oxide stack 115 of the transistor 220 illustrated in FIGS. 6A to 6C, the second oxide layer 110 is formed over the source electrode layer 112a and the drain electrode layer 112b to be in contact with part of the second oxide semiconductor layer 108, which is not covered with the source electrode layer 112a and the drain electrode layer 112b. In the transistor 220, the second oxide layer 110 and the gate insulating layer 114 are etched in a self-alignment manner with the gate electrode layer 116 used as a mask. In other words, the second oxide layer 110, the gate insulating layer 114, and the gate electrode layer 116 have the same plane shapes in the transistor 220. The other components of the transistor 220 are similar to those of the transistor 200; thus, detailed description thereof is omitted here.

The formation method of the oxide stack 115 included in the transistor 220 is described with reference to FIGS. 7A to 7D. As in the steps of FIGS. 3A to 3D, the base insulating layer 102, the first oxide layer 104, and the first oxide semiconductor layer 106 including the first region 106a and the second region 106b are formed over the substrate 100.

Then, the second oxide semiconductor film is formed to cover the first oxide layer 104 having an island-like shape and the first oxide semiconductor layer 106 having an island-like shape. The second oxide semiconductor film is processed by a photolithography process or the like, and thereby the second oxide semiconductor layer 108 in contact with a part of the base insulating layer 102 is formed to cover the side surfaces of the first oxide layer 104 and the side surfaces and the top surface of the first oxide semiconductor layer 106 (see FIG. 7A).

In the processing into the second oxide semiconductor layer 108, a part (a region not covered with the second oxide semiconductor layer 108 having an island-like shape) of the base insulating layer 102 can be etched to be thinned because of overetching of the second oxide semiconductor film 108A.

After that, in a manner similar to the step of FIG. 4B, a conductive film is formed over the second oxide semiconductor layer 108 and is processed to form the source electrode layer 112a and the drain electrode layer 112b. When the conductive film is processed, a part (a region not covered with the source electrode layer 112a and the drain electrode layer 112b) of the base insulating layer 102 and/or the second oxide semiconductor layer 108 is etched to be thinned in some cases.

Figure 7A:
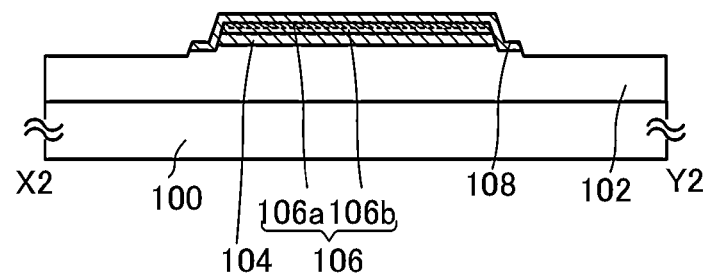
FIGS. 7A to 7D are cross-sectional views illustrating an example of a method for manufacturing a semiconductor device.
Figure 7B:
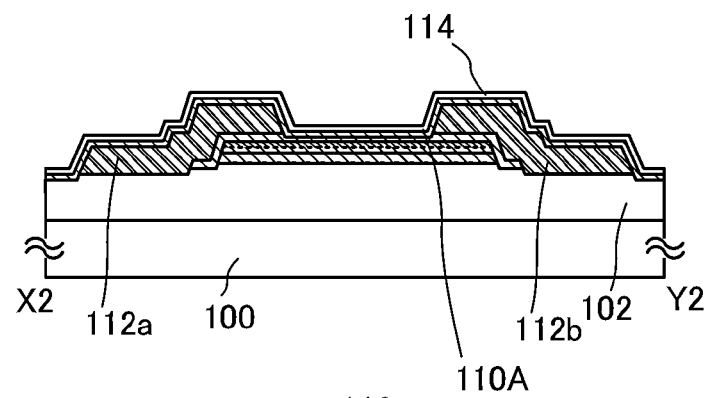

Then, the second oxide layer 110A is formed over the source electrode layer 112a and the drain electrode layer 112b to be in contact with the second oxide semiconductor layer 108 exposed between the source electrode layer 112a and the drain electrode layer 112b, and the gate insulating layer 114 is formed over the second oxide layer 110A (see FIG. 7B).

By successive formation of the second oxide layer 110A and the gate insulating layer 114 without exposure to the air, impurities such as hydrogen and moisture can be prevented from being adsorbed onto a surface of the second oxide layer 110A, which is preferable.

Note that, if a part of the base insulating layer 102 is exposed by patterning the second oxide layer 110A prior to the formation of the gate insulating layer 114, oxygen might be released from the base insulating layer 102 to the outside (e.g., deposition atmosphere) by heating at the time of forming the gate insulating layer 114. The base insulating layer 102 is a layer serving as a source of oxygen to the oxide stack 115, and the release of oxygen from the base insulating layer 102 to the outside leads to a reduction in oxygen supplied to the first oxide semiconductor layer 106 and may consequently cause generation of oxygen vacancies in the oxide stack 115. However, in the manufacturing method of the transistor 220 illustrated in FIGS. 7A to 7D, because the base insulating layer 102 is covered with the second oxide layer 110A at the formation of the gate insulating layer 114, oxygen can be prevented from being released from the base insulating layer 102. Therefore, the oxygen vacancies that can be formed in the oxide stack 115 in the transistor 220 can be reduced.

Figure 7C:
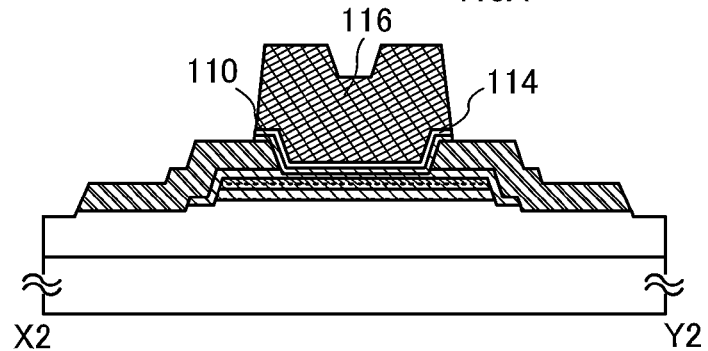

Then, as in the step of FIG. 4C, the gate electrode layer 116 is formed over the gate insulating layer 114, and the gate insulating layer 114 and the second oxide layer 110A are processed in a self-alignment manner with the gate electrode layer 116 used as a mask (see FIG. 7C).

By processing the second oxide layer 110A into the second oxide layer 110, outward diffusion of indium contained in the second oxide layer 110 can be prevented. The outward diffusion of indium is a factor causing variations in electrical characteristics of transistors or a factor of contamination in a deposition chamber in the process. Thus, the processing for forming the second oxide layer 110 using the gate electrode layer 114 as a mask is effective. Furthermore, in a later step, the processing for forming the second oxide layer 110 can prevent generation of an etching residue for the following reason. If the second oxide layer 110A remains in contact hole formation regions at the time of forming contact holes that electrically connect the source and drain electrode layers 112a and 112b to the electrode layers 122a and 122b, an etching residue tends to be generated owing to the difference in etching rate between the second oxide layer 110A and the insulating layer 118 or the insulating layer 120 that are formed later. Accordingly, the formation of the second oxide layer 110 can prevent the residue from being generated.

Note that the processing for forming the second oxide layer 110 and the gate insulating layer 114 can be performed before the gate electrode layer 116 is formed. In such a case, the photomask used for the processing for forming the first oxide layer 104 and the first oxide semiconductor layer 106 or the photomask for forming the second oxide semiconductor layer 108 is preferably used for the processing for forming the second oxide layer 110 and the gate insulating layer 114 to reduce the number of masks. Note that if a resist mask is formed in contact with the second oxide layer 110, a surface of the second oxide layer 110 might be damaged (e.g., contamination with impurities, a reduction in thickness, or generation of oxygen vacancies) by chemical solution treatment for removing the resist mask or the like. Accordingly, the processing for forming the second oxide layer 110 is preferably performed with use of a resist mask formed over the gate insulating layer 114.

Figure 7D:
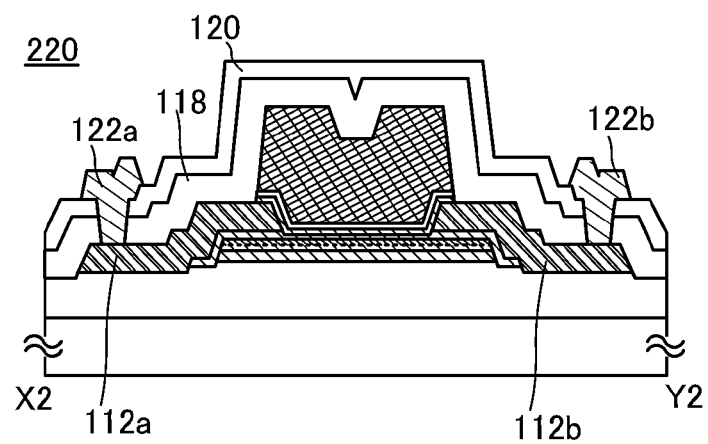

After that, as in the step of FIG. 4D, the insulating layer 118 and the insulating layer 120 are formed and the electrode layer 122a and the electrode layer 122b electrically connected to the source electrode layer 112a and the drain electrode layer 112b through contact holes formed in the insulating layer 118 and the insulating layer 120 are formed (see FIG. 7D).

Through the steps, the transistor 220 can be formed.

<Structural Example 4 of Semiconductor Device>

FIGS. 8A to 8D illustrates structural examples of a transistor 230 and a transistor 240.

Figure 8A:
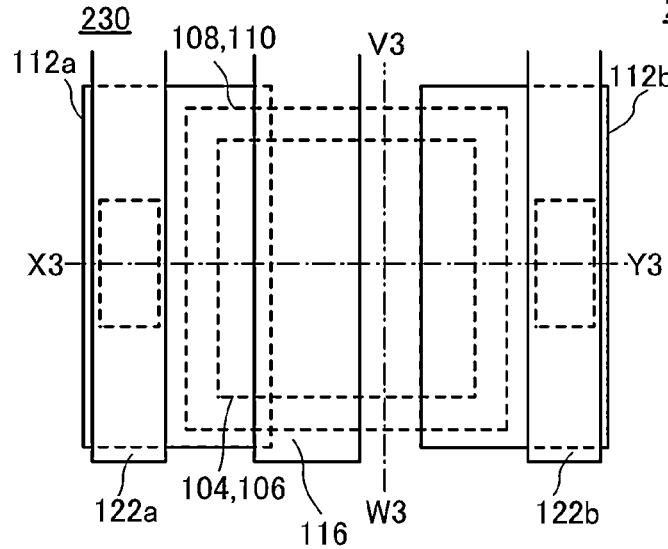
FIGS. 8A to 8D are a plan view and cross-sectional views illustrating one embodiment of a semiconductor device.
Figure 8B:
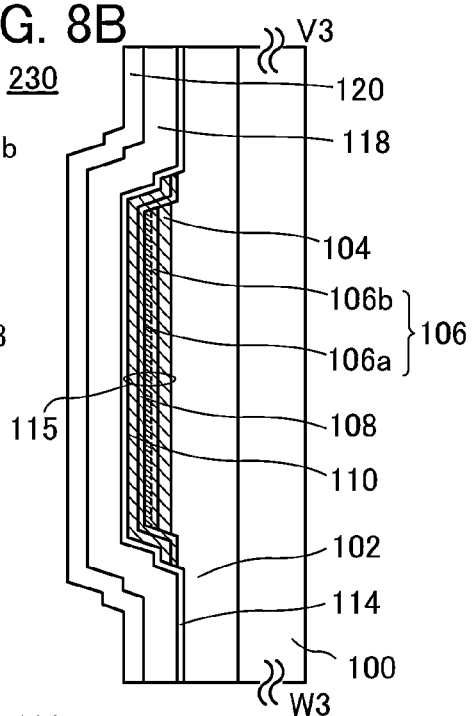
Figure 8C:
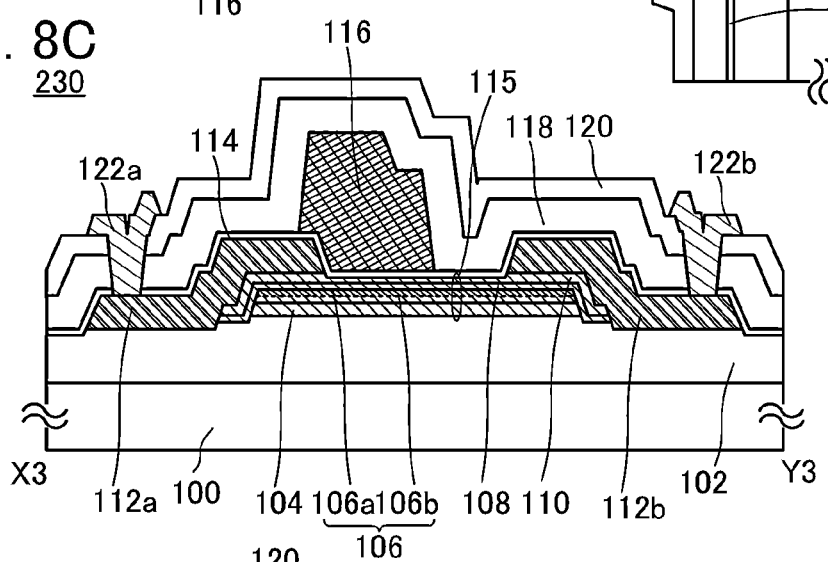

FIG. 8A is a plan view of the transistor 230, FIG. 8B is a cross-sectional view of the transistor 230 taken along the line V3-W3 in FIG. 8A and FIG. 8C is a cross-sectional view of the transistor 230 taken along the line X3-Y3 in FIG. 8A.

The transistor 230 is different from the transistor 200 in the shape of the gate electrode layer 116, but the other components are identical. The other components of the transistor 230 are similar to those of the transistor 200; thus, detailed description thereof is omitted here.

The gate electrode layer 116 of the transistor 230 is overlapped with the source electrode layer 112a but is not overlapped with the drain electrode layer 112b. The withstand voltage between a gate and a drain can be improved in such a manner that the drain electrode layer 112b is formed to be apart from and not to be overlapped with the gate electrode layer 116. Accordingly, even when the transistor 230 is driven by an extremely high voltage, a high reliability can be secured.

Figure 8D:
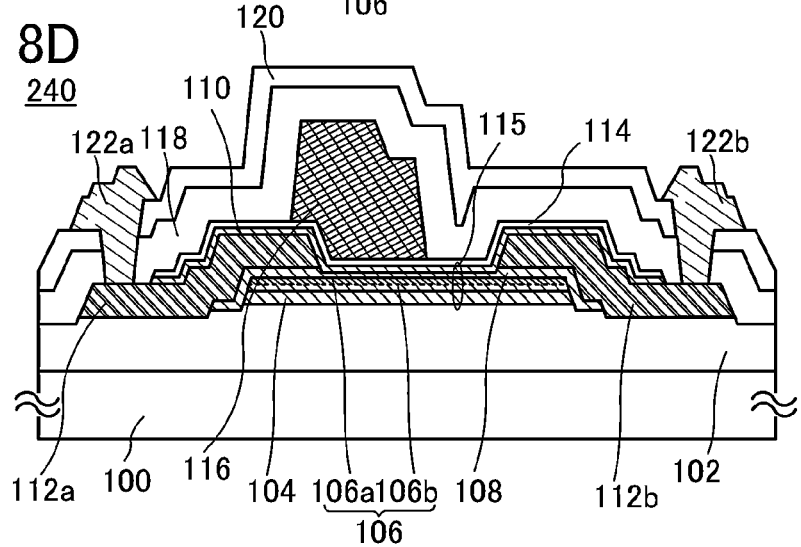

FIG. 8D is a cross-sectional view of the transistor 240. The transistor illustrated in FIG. 8D includes the gate electrode layer 116 that is overlapped with the source electrode layer 112a but is not overlapped with the drain electrode layer 112b, in a similar manner to that of the transistor 230.

In addition, as in the transistor 220 in FIGS. 6A to 6C, the transistor 240 has a structure in which the second oxide layer 110 in the oxide stack 115 is formed over the source electrode layer 112a and the drain electrode layer 112b to be in contact with a part of the second oxide semiconductor layer 108, which is not covered with the source electrode layer 112a and the drain electrode layer 112b. Because the gate electrode layer 116 is not overlapped with the drain electrode layer 112b in the transistor 240, it is difficult to process the second oxide film with the gate electrode layer 116 used as a mask, as described in the manufacturing process of the transistor 220.

Therefore, it is preferable to form a mask over the gate insulating layer 114 by a photolithography process or the like for forming the second oxide layer 110. Alternatively, a photomask used for forming the first oxide layer 104 and the first oxide semiconductor layer 106 or a photomask used for forming the second oxide semiconductor layer 108 is preferably used, in which case the number of masks can be reduced.

The structures, the methods, and the like described in this embodiment can be combined as appropriate with any of the structures, the methods, and the like described in the other embodiments.

Embodiment 2

In this embodiment, one embodiment of a semiconductor device and a method for manufacturing the semiconductor device, which is different from Embodiment 1, will be described with reference to FIGS. 9A to 9D, FIGS. 10A to 10D, FIGS. 11A to 11C, and FIGS. 12A to 12D. In this embodiment, for the same portions as Embodiment 1 or portions having functions similar to those in Embodiment 1, Embodiment 1 can be referred to and repetitive description is omitted. In this embodiment, a top gate transistor including an oxide semiconductor layer will be described as an example of the semiconductor device.

<Structure Example 5 of Semiconductor Device>

FIGS. 9A to 9C illustrate a structural example of a transistor 250. FIG. 9A is a plan view of the transistor 250, FIG. 9B is a cross-sectional view of the transistor 250 taken along the line V4-W4 in FIG. 9A and FIG. 9C is a cross-sectional view of the transistor 250 taken along the line X4-Y4 in FIG. 9A.

An oxide stack 165 included in the transistor 250 illustrated in FIGS. 9A to 9C includes a first oxide layer 154, a first oxide semiconductor layer 156, a second oxide semiconductor layer 158, and a second oxide layer 160. In addition, the first oxide semiconductor layer 156 includes a first region 156a containing an impurity imparting n-type conductivity and a second region 156b that is i-type or substantially i-type. The components of the transistor 250 other than the oxide stack 165 in FIGS. 9A to 9C are the same as those of the transistor 200 illustrated in FIGS. 1A to 1C.

The first oxide semiconductor layer 156 and the second oxide semiconductor layer 158 included in the oxide stack 165 preferably include at least indium (In) or zinc (Zn). Alternatively, both In and Zn are preferably included. In order to reduce fluctuations in electrical characteristics of the transistors including the oxide semiconductor layer, the oxide semiconductor layer preferably contains a stabilizer in addition to indium and zinc. Specifically, similar materials to that of the first oxide semiconductor layer 106 or the second oxide semiconductor layer 108 can be used.

The first oxide layer 154 included in the oxide stack 165 can have a structure similar to that of the first oxide layer 104 described above. In addition, the second oxide layer 160 included in the oxide stack 165 can have the same structure as that of the second oxide layer 110.

The first region 156a included in the first oxide semiconductor layer 156 is formed in such a manner that an impurity imparting n-type conductivity is supplied with the source electrode layer 112a and the drain electrode layer 112b used as a mask. Thus, in the plan view, one of the end portions in the channel length direction of the first region 156a coincides with an end portion on the channel side of the source electrode layer 112a, and the other of the end portions in the channel length direction of the first region 156a coincides with an end portion on the channel side of the drain electrode layer 112b. As illustrated in FIG. 9B, the first region 156a in the channel width direction extends to the end portion of the first oxide semiconductor layer 156 and is in contact with the gate insulating layer 114.

In addition, the first oxide semiconductor layer 156 includes the second region 156b that is i-type or substantially i-type in areas overlapping with the source electrode layer 112a and the drain electrode layer 112b and in the vicinity of the interface with the first oxide layer 154.

The second oxide semiconductor layer 158 is formed to be in contact with the first region 156a of the first oxide semiconductor layer 156 and to cover the top surface of the first oxide semiconductor layer 156. The second oxide semiconductor layer 158 preferably includes i-type or substantially i-type oxide semiconductor.

The transistor 250 includes the second region 156b and the second oxide semiconductor layer 158 that are i-type or substantially i-type between the first region 156a and the source electrode layer 112a and between the first region and the drain electrode layer 112b, and thus on/off operations of the transistor can be performed reliably. Furthermore, the transistor 250 can be normally off.

The transistor 250 includes the first region 156a containing an impurity imparting n-type conductivity in a region overlapping with the gate electrode layer 116 in the first oxide semiconductor layer 156 where a channel is formed; therefore, the series resistance can be reduced between a source and a drain when the transistor 250 is on. As a result, the current flowing between the source and the drain in the on state (also referred to as on-state current) can be increased.

The oxide stack 165 included in the transistor 250 can be formed by a one-mask etching step, leading to reduction in the number of manufacturing steps and the cost of the semiconductor device.

A transistor 260 illustrated in FIG. 9D is a variation of the transistor 250. The transistor 260 is different from the transistor 250 in the shape of the gate electrode layer 116 and the other components are identical.

The gate electrode layer 116 of the transistor 260 is overlapped with the source electrode layer 112a but not overlapped with the drain electrode layer 112b, as in the transistors 230 and 240 in Embodiment 1. The withstand voltage between a gate and a drain can be improved in such a manner that the drain electrode layer 112b is formed to be apart from and not to be overlapped with the gate electrode layer 116. Accordingly, even when the transistor 260 is driven by an extremely high voltage, a high reliability can be secured.

Next, an example of a method for manufacturing the transistor 250 is described using FIGS. 10A to 10D.

Figure 10A:
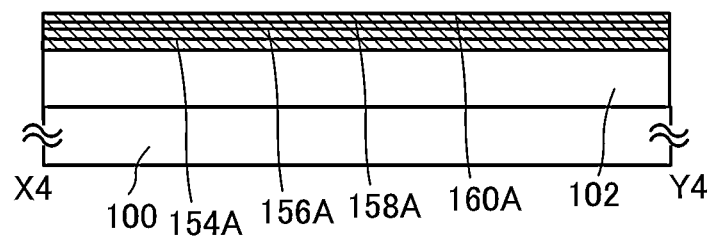
FIGS. 10A to 10D are cross-sectional views illustrating an example of a method for manufacturing a semiconductor device.

The base insulating layer 102 is formed over the substrate 100, and a first oxide film 154A, a first oxide semiconductor film 156A, a second oxide semiconductor film 158A, and a second oxide film 160A are stacked over the base insulating layer 102 (see FIG. 10A). Note that instead of the stacked structure of the first oxide semiconductor film 156A and the second oxide semiconductor film 158A, a single layer of oxide semiconductor film may be employed.

For the formation of the first oxide film 154A, the first oxide semiconductor film 156A, the second oxide semiconductor film 158A, and the second oxide film 160A, refer to the formation process of the first oxide film 104A, the first oxide semiconductor film 106A, the second oxide semiconductor film 108A, and the second oxide layer 110A in Embodiment 1.

Figure 10B:
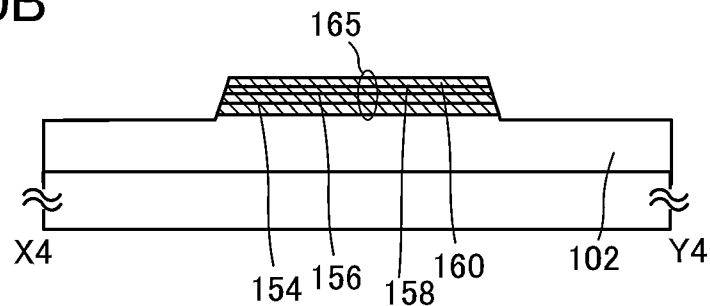

Then, the first oxide film 154A, the first oxide semiconductor film 156A, the second oxide semiconductor film 158A, and the second oxide film 160A are processed by a photolithography process or the like to form the first oxide layer 154, the first oxide semiconductor layer 156, the second oxide semiconductor layer 158, and the second oxide layer 160 (see FIG. 10B). Here, the first oxide film 154A, the first oxide semiconductor film 156A, the second oxide semiconductor film 158A, and the second oxide film 160A can be processed by etching with use of the same mask. Therefore, the plane shapes of the first oxide layer 154, the first oxide semiconductor layer 156, the second oxide semiconductor layer 158, and the second oxide layer 160 are identical with each other, that is, an upper end of a side surface of the first oxide layer 154 coincides with a lower end of a side surface of the first oxide semiconductor layer 156, an upper end of a side surface of the first oxide semiconductor layer 156 coincides with a lower end of a side surface of the second oxide semiconductor layer 158, and an upper end of a side surface of the second oxide semiconductor layer 158 coincides with a lower end of a side surface of the second oxide layer 160.

Through this processing, the oxide stack 165 including the first oxide layer 154, the first oxide semiconductor layer 156, the second oxide semiconductor layer 158, and the second oxide layer 160 is formed.

In the processing into the oxide stack 165, a part (a region not covered with the oxide stack 165 having an island-like shape) of the base insulating layer 102 is etched to be thinned due to overetching of the first oxide film 154A in some cases.

Figure 10C:
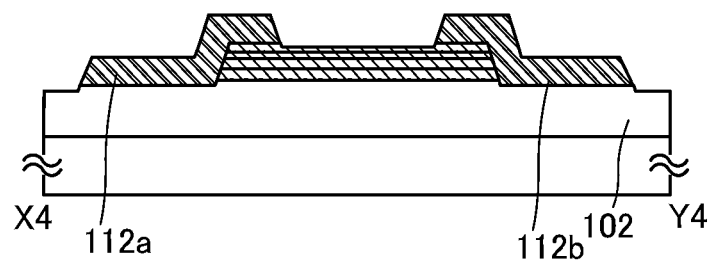

Then, as in the step of FIG. 4B, a conductive film is formed over the second oxide layer 160, and the conductive film is processed to form the source electrode layer 112a and the drain electrode layer 112b (see FIG. 10C). In the processing into the source electrode layer 112a and the drain electrode layer 112b, a part of the base insulating layer 102 is etched to be thinned due to overetching of the conductive film in some cases.

Figure 10D:
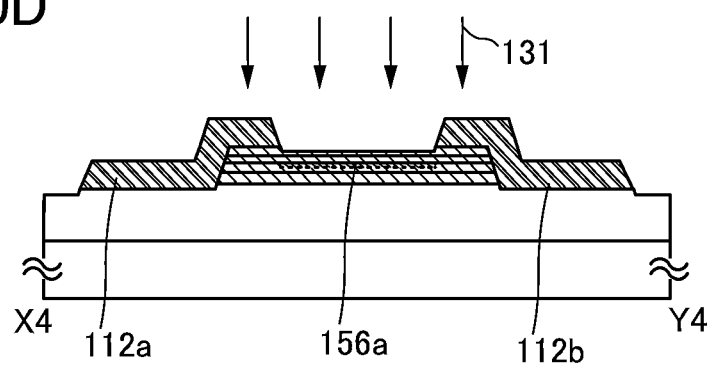

After that, with the source electrode layer 112a and the drain electrode layer 112b used as a mask, an element 131 is supplied into the first oxide semiconductor layer 156 through the second oxide layer 160 and thus the first region 156a containing the element 131 is formed (see FIG. 10D). Here, the element 131 is included in a region that is a part of the first oxide semiconductor layer 156, and is overlapped with neither the source electrode layer 112a nor the drain electrode layer 112b.

The element 131 is preferably an element with an oxygen affinity. When such an element with an oxygen affinity is supplied into the first oxide semiconductor layer 156, the element extracts oxygen contained in the first oxide semiconductor layer 156 to form an oxygen vacancy, and thus the first region 156a supplied with the element becomes an n-type region.

Examples of the element with an oxygen affinity are tungsten (W), titanium (Ti), boron (B), aluminum (Al), and zinc (Zn). Furthermore, the element 131 may be included in a state of a radical, an atom, a molecule, or an ion.

For the method for supplying the element 131, refer to the method for supplying the element 130 described above.

Note that the conditions for supplying the element 131 are preferably determined so that the element 131 cannot reach the interface between the first oxide semiconductor layer 156 and the first oxide layer 154. The element 131 is preferably supplied to an area in the vicinity of the interface between the first oxide semiconductor layer 156 and the second oxide semiconductor layer 158 on the first oxide semiconductor layer 156 side (for example, in the area that is 20 nm or less from the interface, preferably 10 nm or less from the interface, further preferably 5 nm or less from the interface). Alternatively, the element 131 is preferably supplied in such a manner that a region having the highest concentration of the element 131 is located in an area that is $3/4$ or less of the thickness of the first oxide semiconductor layer from the interface, preferably $1/2$ or less from the interface, further preferably $1/4$ or less from the interface.

Note that it is difficult to supply the element 131 into only the first oxide semiconductor layer 156, and thus the element 131 might be contained in areas that are in the second oxide semiconductor layer 158 and the second oxide layer 160 and are overlapped with neither the source electrode layer 112a nor the drain electrode layer 112b.

Figure 11A:
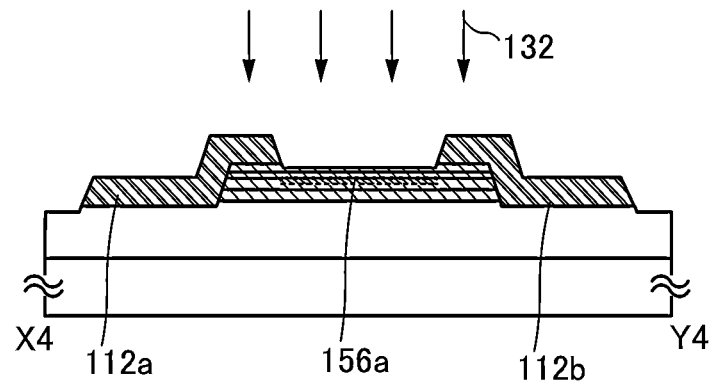
FIGS. 11A to 11C are cross-sectional views illustrating an example of a method for manufacturing a semiconductor device.

Thus, with the source electrode layer 112a and the drain electrode layer 112b used as a mask, oxygen 132 is supplied into the second oxide layer 160 and the second oxide semiconductor layer 158 (see FIG. 11A). By supplying oxygen, an oxygen vacancy that can be formed in the second oxide semiconductor layer 158 and the second oxide layer 160 by the supplied element 131 can be compensated. By this supply of oxygen, the second oxide layer 160 and the second oxide semiconductor layer 158 can be made i-type or substantially i-type.

The supply of oxygen 132 can be performed by an ion implantation method, an ion doping method, a plasma ion immersion implantation method, plasma treatment, or the like, for example. A gas containing oxygen can be used for the supply of oxygen. As a gas containing oxygen, oxygen, dinitrogen monoxide, nitrogen dioxide, or the like can be used. Further, a rare gas may be included in the gas containing oxygen for the oxygen supply treatment.

The conditions for supplying the oxygen 132 are preferably determined such that a region having the highest concentration of the oxygen 132 is formed closer to the upper surface of the oxide stack 165 than the region having the highest concentration of the element 131 supplied earlier. In this manner, the first region 156a that is an n-type region can be formed in the first oxide semiconductor layer 156, and the second oxide semiconductor layer 158 and the second oxide layer 160 that are i-type or substantially i-type regions can be formed between the first region 156a and the upper surface of the oxide stack 165. In other words, a double-well structure illustrated in FIGS. 2A and 2B can be formed in the energy band. Accordingly, the transistor 250 including the oxide stack 165 can feed a large amount of current.

Note that the second oxide layer 160 and/or the second oxide semiconductor layer 158 may be made i-type or substantially i-type by plasma treatment such as oxygen plasma treatment or $N_2O$ plasma treatment, or $O_2$ ashing treatment, instead of supplying the oxygen 132. Alternatively, the oxygen plasma treatment or $N_2O$ plasma treatment, or the $O_2$ ashing treatment may be combined with the supply of the oxygen 132.

The step of supplying the element 131 in FIG. 10D and the step of supplying the oxygen 132 in FIG. 11A can both be performed in self-alignment manners with use of the source electrode layer 112a and the drain electrode layer 112b as a mask, and thus the process can be performed with high controllability without an increase in the number of masks.

Figure 11B:
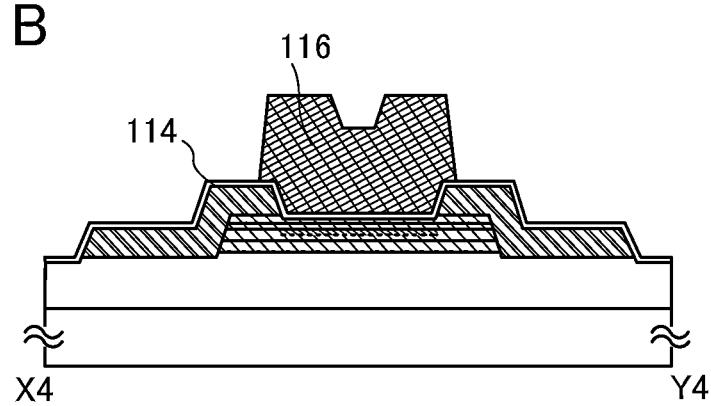

Then, as in the step of FIG. 4C, the gate insulating layer 114 and the gate electrode layer 116 are formed over the oxide stack 165 (see FIG. 11B).

Figure 11C:
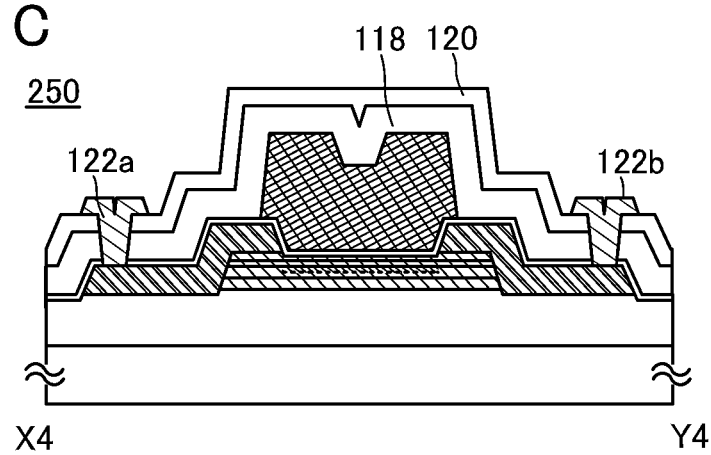

Then as in the step of FIG. 4D, the insulating layer 118 and the insulating layer 120 are formed over the gate electrode layer 116, and the electrode layer 122a and the electrode layer 122b electrically connected to the source electrode layer 112a and the drain electrode layer 112b through contact holes formed in the insulating layer 118 and the insulating layer 120 are formed (see FIG. 11C).

In the above manner, the transistor 250 can be formed.

<Structure Example 6 of Semiconductor Device>

Figure 12A:
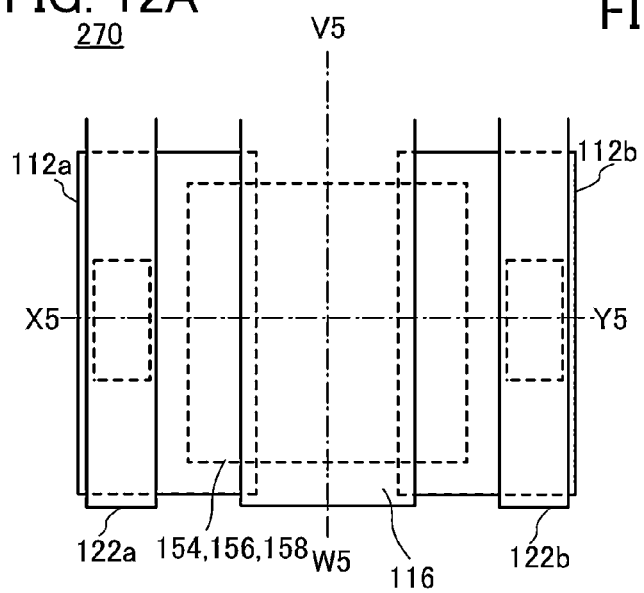
FIGS. 12A to 12D are a plan view and cross-sectional views illustrating one embodiment of a semiconductor device.
Figure 12B:
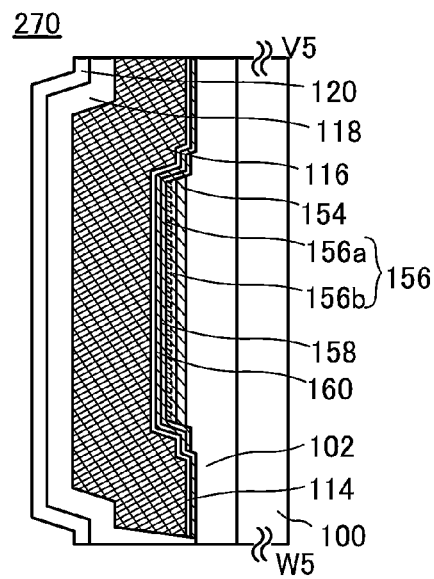
Figure 12C:
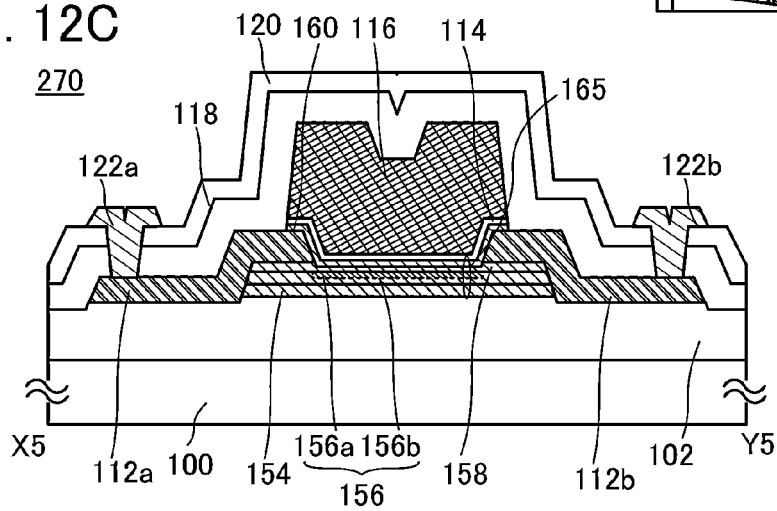

FIGS. 12A to 12C illustrate a structural example of a transistor 270. FIG. 12A is a plan view of the transistor 270, FIG. 12B is a cross-sectional view of the transistor 270 taken along the line V5-W5 in FIG. 12A, and FIG. 12C is a cross-sectional view of the transistor 270 taken along the line X5-Y5 in FIG. 12A.

The transistors illustrated in FIGS. 12A to 12D are variations of the transistor 250, and have a structure in which the second oxide layer 160 is formed over the source electrode layer 112a and the drain electrode layer 112b to be in contact with part of the second oxide semiconductor layer 158, which is not covered with the source electrode layer 112a and the drain electrode layer 112b.

In the transistor 270, the first region 156a included in the first oxide semiconductor layer 156 can be formed in the following manner: the source electrode layer 112a and the drain electrode layer 112b are formed over the first oxide layer 154, the first oxide semiconductor layer 156, and the second oxide semiconductor layer 158 that have an island-like shape, and an element with an oxygen affinity is supplied with the source electrode layer 112a and the drain electrode layer 112b used as a mask as in the step of FIG. 10D.

In addition, in the step of supplying the element with an oxygen affinity, the element may be supplied into a region overlapping with the first region 156a in the second oxide semiconductor layer 158. Thus, after the step of supplying the element with an oxygen affinity, oxygen is preferably supplied into the region overlapping with the first region 156a in the second oxide semiconductor layer 158. The step of supplying oxygen may be performed as in the formation process of the transistor 250 or oxygen contained in the second oxide layer 160 formed in contact with the second oxide semiconductor layer 158 may be diffused by heat treatment.

Figure 12D:
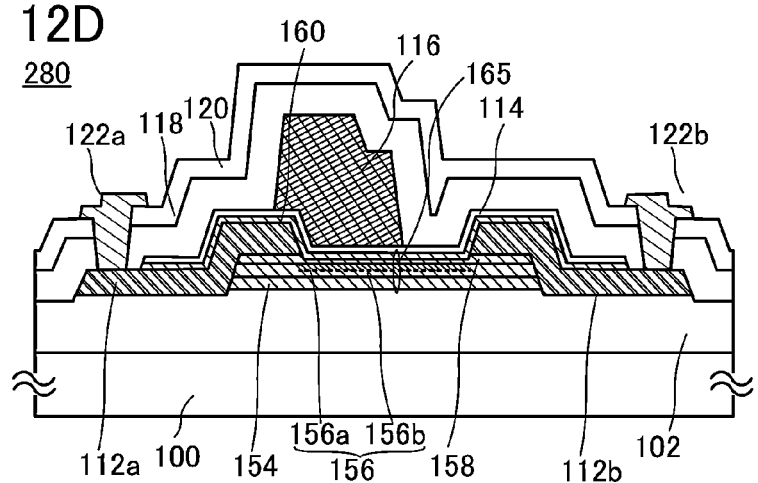

The transistor 280 illustrated in FIG. 12D is a variation of the transistor 270, and is different from the transistor 270 in the shape of the gate electrode layer 116, and the other components of the transistor 280 are the same as those of the transistor 270.

The gate electrode layer 116 of the transistor 280 is overlapped with the source electrode layer 112a but is not overlapped with the drain electrode layer 112b, as in the transistors 230 and 240 in Embodiment 1. The withstand voltage between a gate and a drain can be improved in such a manner that the drain electrode layer 112b is formed to be apart from and not to be overlapped with the gate electrode layer 116. Accordingly, even when the transistor 280 is driven by an extremely high voltage, a high reliability can be secured.

As described above, because each transistor in this embodiment has a structure in which the first region 156a containing an impurity imparting n-type conductivity is formed in a region overlapping with the gate electrode layer 116 in the first oxide semiconductor layer 156 where a channel is formed, the series resistance between a source and a drain of the transistor in an on state can be reduced. As a result, current flowing between the source and the drain in the on state (the current is also referred to as on-state current) can be increased.

In addition, the impurity imparting n-type conductivity is supplied in a self-alignment manner with the source electrode layer 112a and the drain electrode layer 112b used as a mask; therefore, the controllability and yield in manufacturing the semiconductor device can be improved.

Furthermore, because the second region 156b and the second oxide semiconductor layer 158 that are i-type or substantially i-type are included between the source electrode layer 112a and the first region 156a and between the drain electrode layer 112b and the first region 156a, the transistor can perform on/off operations reliably. Furthermore, the transistor can be normally off.

The structures, the methods, and the like described in this embodiment can be combined as appropriate with any of the structures, the methods, and the like described in the other embodiments.

Embodiment 3

In this embodiment, an example of an oxide semiconductor layer applicable to the transistors of Embodiment 1 or 2 will be described.

<Crystallinity of Oxide Semiconductor Layer>

The oxide semiconductor layer is classified roughly into a single crystal oxide semiconductor layer and a non-single-crystal oxide semiconductor layer. As examples of the non-single-crystal oxide semiconductor layer, an amorphous oxide semiconductor film, a c-axis aligned crystalline oxide semiconductor (CAAC-OS) film, a polycrystalline oxide semiconductor film, a microcrystalline oxide semiconductor film, and the like can be given.

For example, the first oxide semiconductor layer or the second oxide semiconductor layer in the transistor may include a CAAC-OS film. The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film.

In a transmission electron microscope (TEM) image of the CAAC-OS film, a boundary between crystal parts, that is, a grain boundary is not clearly observed. Thus, in the CAAC-OS film, a reduction in electron mobility due to a grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In the structural analysis of the CAAC-OS film with an X-ray diffraction (XRD) apparatus, a peak appears at a diffraction angle ($2\theta$) of around 31° in some cases when the CAAC-OS film including an $InGaZnO_4$ crystal is analyzed by an out-of-plane method, for example. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears at 2θ of around 56° in some cases. This peak is derived from the (110) plane of the InGaZnO$_4$ crystal. Six peaks are observed in an analysis (ϕ scan) of single-crystal oxide semiconductor film of InGaZnO$_4$, under the conditions where the sample is rotated about a normal vector of a sample surface as an axis (ϕ axis) with 2θ fixed at around 56°. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal. Note that in this specification and claims, a simple term "perpendicular" includes a range from 80° to 100°, for example, from 85° to 95°. In addition, the term "parallel" includes a range from −10° to 10°, for example, from −5° to 5°.

Figure 13A:
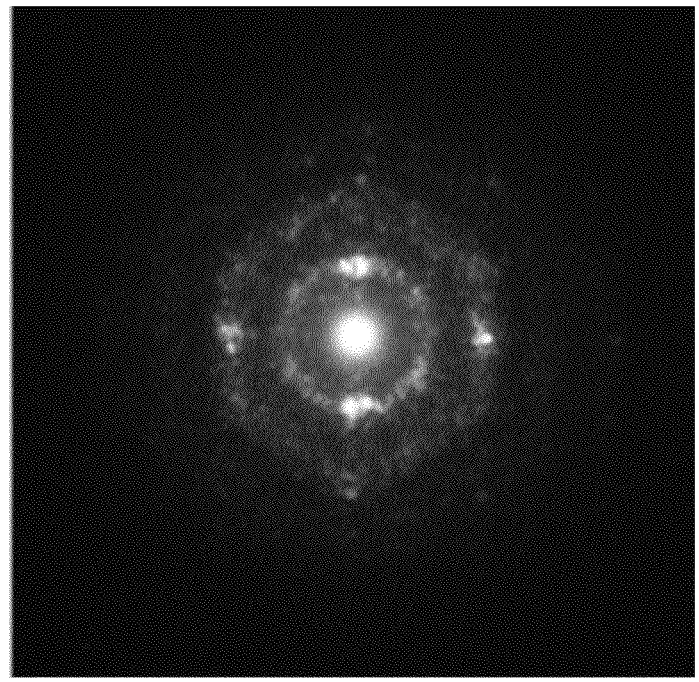
FIGS. 13A and 13B are nanobeam electron diffraction patterns of oxide semiconductors in accordance with one embodiment.

An electron diffraction pattern of the CAAC-OS film gives spots in some cases. An electron diffraction pattern obtained with an electron beam having a diameter of 10 nmϕ or smaller, or 5 nmϕ or smaller is called a nanobeam electron diffraction pattern. FIG. 13A is an example of a nanobeam electron diffraction pattern of a sample including the CAAC-OS film. Here, the sample is cut in the direction perpendicular to a formation surface of the CAAC-OS film and the thickness thereof is reduced to about 40 nm. Further, an electron beam with a diameter of 1 nmϕ is applied from the direction perpendicular to the cut surface of the sample. As shown in FIG. 13A, spots are observed in the nanobeam electron diffraction pattern of the CAAC-OS film.

The CAAC-OS film can be obtained by reducing the impurity concentration in some cases. The impurity means here an element other than the main components of the oxide semiconductor, such as hydrogen, carbon, silicon, or a transition metal element. In particular, the bond strength of an element such as silicon with oxygen is higher than that of a metal element included in the oxide semiconductor. Therefore, when the element abstracts oxygen in the oxide semiconductor, the atomic arrangement in the oxide semiconductor is disordered, whereby the crystallinity of the oxide semiconductor is lowered in some cases. In addition, a heavy metal such as iron or nickel, argon, carbon dioxide, or the like has a large atomic radius (or molecular radius), and thus disorders the atomic arrangement in the oxide semiconductor, whereby the crystallinity of the oxide semiconductor is lowered in some cases. Hence, the CAAC-OS is regarded as an oxide semiconductor with a low impurity concentration.

The state in which impurity concentration is low and density of defect states is low (the number of oxygen vacancies is small) is referred to as a "highly purified intrinsic" state or a "substantially highly purified intrinsic" state. A highly purified intrinsic or substantially highly purified intrinsic oxide semiconductor has few carrier generation sources, and thus has a low carrier density. Thus, a transistor including the oxide semiconductor in a channel formation region rarely has a negative threshold voltage (is rarely normally-on). A highly purified intrinsic or substantially highly purified intrinsic oxide semiconductor is able to have a low density of defect states and accordingly has low density of trap states. Thus, the transistor including the oxide semiconductor in the channel formation region is capable of having small variations in electrical characteristics and high reliability. In contrast, the impurity included in the oxide semiconductor readily serves as a carrier source and gives a trap level. Additionally, a charge trapped by the trap states in the oxide semiconductor requires a long time to disappear. The trapped charge may behave like a fixed charge. Thus, the transistor that includes the oxide semiconductor having a high density of trap states in the channel formation region readily has unstable electrical characteristics.

The crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

The degree of crystallinity in the CAAC-OS film is not necessarily uniform. For example, in the case where crystal growth to the CAAC-OS film occurs from the vicinity of the top surface of the film, the degree of the crystallinity in the vicinity of the top surface is higher than that in the vicinity of the formation surface in some cases. When an impurity is added to the CAAC-OS film, the crystallinity in a region to which the impurity is added is changed, and the degree of crystallinity in the CAAC-OS film may vary depending on regions.

When the CAAC-OS film with an InGaZnO$_4$ crystal is analyzed by an out-of-plane method, a peak of 2θ may also be observed at around 36°, in addition to at around 31°. The peak of 2θ at around 36° indicates that a crystal having no c-axis alignment is included in part of the CAAC-OS film. It is preferable that in the CAAC-OS film, a peak of 2θ appears at around 31° and does not appear at around 36°.

The CAAC-OS film can also be formed by reducing the density of defect states for example. As mentioned above, oxygen vacancies in an oxide semiconductor are defect states and serve as trap levels or as carrier sources when hydrogen is trapped therein. In order to form the CAAC-OS film, it is important to prevent generation of oxygen vacancies in the oxide semiconductor. Thus, the CAAC-OS film is an oxide semiconductor film having a low density of defect states. In other words, the CAAC-OS film is an oxide semiconductor film having few oxygen vacancies.

With the use of the highly purified intrinsic or substantially highly purified intrinsic CAAC-OS film in a transistor, variations in the electrical characteristics of the transistor due to irradiation with visible light or ultraviolet light are small. Thus, the transistor has high reliability.

The CAAC-OS film can be formed by a sputtering method using a DC power source, for example.

The first oxide semiconductor layer or the second oxide semiconductor layer used in the transistor may be a polycrystalline oxide semiconductor film including a plurality of crystal grains. A crystal grain with a grain size of equal to 2 nm and less than or equal to 300 nm, greater than or equal to 3 nm and less than or equal to 100 nm, or greater than or equal to 5 nm and less than or equal to 50 nm is frequently observed in a TEM image of the polycrystalline oxide semiconductor film. In the TEM image, a boundary between crystal grains can be found in the polycrystalline oxide semiconductor film in some cases.

The plurality of crystal grains of the polycrystalline oxide semiconductor film may be different in crystal orientation therebetween. When a polycrystalline oxide semiconductor film is analyzed by an out-of-plane method with use of an XRD apparatus, a plurality of orientation peaks including a peak at 2θ of around 31° appear in some cases. Further, spots are observed in a nanobeam electron diffraction pattern of the polycrystalline oxide semiconductor film in some cases.

The polycrystalline oxide semiconductor film has high crystallinity and thus is possible to provide high electron mobility. Accordingly, a transistor using the polycrystalline oxide semiconductor film for a channel formation region has high field-effect mobility. Note that, in the case where an impurity is segregated at the grain boundary in the polycrystalline oxide semiconductor film, the grain boundary may serve as a defect state, a trap state, or a carrier generation source. Hence, a transistor using the polycrystalline oxide semiconductor film for a channel formation region has larger variations in electrical characteristics and lower reliability than a transistor using a CAAC-OS film for a channel formation region in some cases.

The polycrystalline oxide semiconductor film can be formed by high-temperature heat treatment or laser light treatment.

The first oxide semiconductor layer or the second oxide semiconductor layer used in the transistor may be a microcrystalline oxide semiconductor film. In the TEM image of the microcrystalline oxide semiconductor film, crystal parts cannot be usually found clearly. The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order, that is, a lower density of defect states than the amorphous oxide semiconductor film. Similarly, in the TEM image of the microcrystalline oxide semiconductor film, a boundary between crystal parts cannot be usually found clearly. Accordingly, in the microcrystalline oxide semiconductor film, segregation of impurities is less likely to occur, that is, the density of defect states is unlikely to be high. In addition, a reduction in electron mobility is small.

Figure 13B:
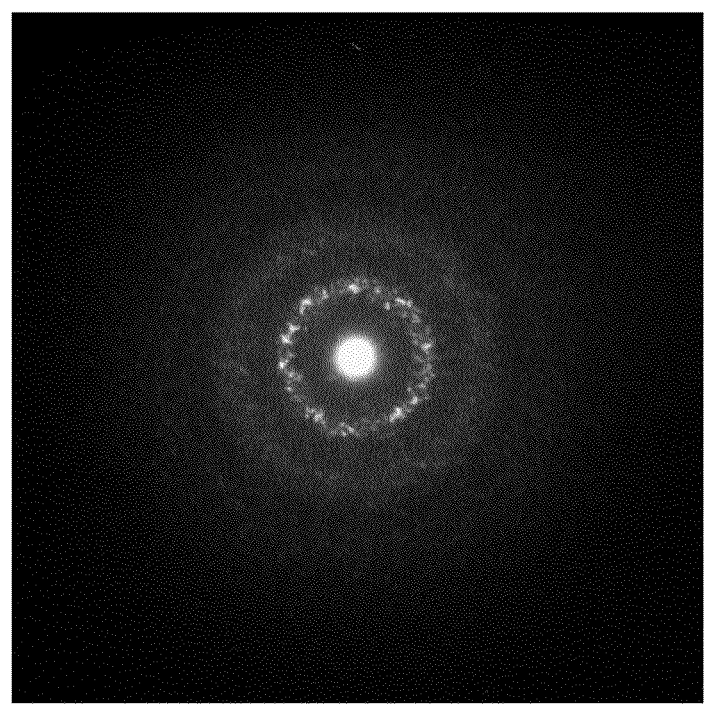

FIG. 13B shows an example of a nanobeam electron diffraction pattern of a sample including a microcrystalline oxide semiconductor film. Here, a sample of the microcrystalline oxide semiconductor film is cut in the direction perpendicular to a surface on which the microcrystalline oxide semiconductor film is formed, and the thickness thereof is reduced to about 40 nm. An electron beam with a diameter of 1 nmϕ is emitted from the direction perpendicular to the cut surface of the sample. In the nanobeam electron diffraction pattern of the microcrystalline oxide semiconductor film in FIG. 13B, a plurality of circumferentially distributed spots are observed.

Since the microscopic region in the microcrystalline oxide semiconductor film has a periodic atomic order, the microcrystalline oxide semiconductor film has lower density of defect states than the amorphous oxide semiconductor. Note that since crystal parts in the microcrystalline oxide semiconductor film are not regularly arranged, the microcrystalline oxide semiconductor film has higher density of defect states than the CAAC-OS film.

Accordingly, the microcrystalline oxide semiconductor film has a higher carrier density than the CAAC-OS film, in some cases. Since an oxide semiconductor with high carrier density tends to have high electron mobility, a transistor including the microcrystalline oxide semiconductor film for a channel formation region tends to have a high field-effect mobility. Further, since the microcrystalline oxide semiconductor film has higher density of defect states than the CAAC-OS film, the microcrystalline oxide semiconductor film tends to have higher density of trap states. Accordingly, a transistor using the microcrystalline oxide semiconductor film for a channel formation region usually has larger variations in electrical characteristics and lower reliability than those of a transistor using the CAAC-OS film for a channel formation region. The microcrystalline oxide semiconductor film can be formed easily as compared to the CAAC-OS film because the microcrystalline oxide semiconductor film can be formed even when a relatively large amount of impurities are included; thus, depending on the purpose, the microcrystalline oxide semiconductor film can be favorably used. For example, the microcrystalline oxide semiconductor film may be formed by a deposition method such as a sputtering method using an AC power source. In this case, since the sputtering method using an AC power source allows a film to be formed with high uniformity over a large substrate, a semiconductor device including a transistor using the microcrystalline oxide semiconductor film for a channel formation region can be manufactured with high productivity.

The first oxide semiconductor layer or the second oxide semiconductor layer used in the transistor may be an amorphous oxide semiconductor film, for example. The amorphous oxide semiconductor film has disordered atomic arrangement and includes no crystalline component. A typical amorphous oxide semiconductor film exists in an amorphous state in the whole area. In the TEM image of the amorphous oxide semiconductor film, crystal parts cannot be found.

When the amorphous oxide semiconductor film is subjected to the analysis by an out-of-plane method with an XRD apparatus, a peak that proves crystal orientation does not appear. Further, a halo pattern is observed in the electron diffraction pattern or the nanobeam electron diffraction pattern of the amorphous oxide semiconductor film.

The amorphous oxide semiconductor film can be formed, for example, by introducing a high-concentration impurity such as hydrogen. Hence, the amorphous oxide semiconductor film is recognized as an oxide semiconductor film containing a high-concentration impurity.

When an oxide semiconductor layer contains a high-concentration impurity, a defect state such as an oxygen vacancy is formed in the oxide semiconductor layer. This means that an amorphous oxide semiconductor film with a high-concentration impurity has a high density of defect states. Since the amorphous oxide semiconductor film has low crystallinity, the density of defect states of the amorphous oxide semiconductor film is higher than those of the CAAC-OS film and the microcrystalline oxide semiconductor film.

Accordingly, the amorphous oxide semiconductor film has higher carrier density than the microcrystalline oxide semiconductor film. Therefore, a transistor using the amorphous oxide semiconductor film for a channel formation region tends to be normally on, and the amorphous oxide semiconductor film can preferably be used for a transistor which needs to have normally on electrical characteristics. The amorphous oxide semiconductor film has a high density of defect states and thus tends to have a high density of trap states. Therefore, a transistor using the amorphous oxide semiconductor for a channel formation region has larger variations in electrical characteristics and lower reliability than those of a transistor using the CAAC-OS film or the microcrystalline oxide semiconductor film for a channel formation region. Note that the amorphous oxide semiconductor film can be formed by a deposition method that causes a relatively large amount of impurity to be contained in the deposited film, and thus can be easily obtained and preferably used depending on the use. For example, the amorphous oxide semiconductor film may be formed by a deposition method such as a spin coating method, a sol-gel method, an immersion method, a spray method, a screen printing method, a contact printing method, an ink-jet printing method, a roll coating method, or a mist CVD method. Hence, a semiconductor device including a transistor using the amorphous oxide semiconductor film for a channel formation region can be manufactured with high productivity.

Note that the oxide semiconductor layer may be a mixed film including two or more of the CAAC-OS film, the polycrystalline oxide semiconductor film, the microcrystalline oxide semiconductor film, and the amorphous oxide semiconductor film. For example, the mixed film includes two or more of an amorphous oxide semiconductor region, a microcrystalline oxide semiconductor region, a polycrystalline oxide semiconductor region, and a CAAC-OS region. Further for example, the mixed film has a stacked-layer structure of two or more of an amorphous oxide semiconductor region, a microcrystalline oxide semiconductor region, a polycrystalline oxide semiconductor region, and a CAAC-OS region.

The first oxide semiconductor layer or the second oxide semiconductor layer used in the transistor may be a single crystal oxide semiconductor film. The single crystal oxide semiconductor film has a low impurity concentration and a low density of defect states (a small number of oxygen vacancies), and thus has a low carrier density. Therefore, a transistor using the single crystal oxide semiconductor film for a channel formation region is unlikely to be normally on. Further, the single crystal oxide semiconductor film has a low density of defect states and thus has a low density of trap states. Therefore, a transistor using the single crystal oxide semiconductor film for a channel formation region has small variations in electrical characteristics and a high reliability.

The density of the oxide semiconductor layer becomes higher as the quantity of defects in the layer is smaller or as the crystallinity of the layer is higher. In addition, as the oxide semiconductor layer has a lower concentration of impurities such as hydrogen, the density of the layer is increased. Usually, the density of a single crystal oxide semiconductor film is higher than that of a CAAC-OS film, the density of a CAAC-OS film is higher than that of a microcrystalline oxide semiconductor film, the density of a polycrystalline oxide semiconductor film is higher than that of a microcrystalline oxide semiconductor film, and the density of a microcrystalline oxide semiconductor film is higher than that of an amorphous oxide semiconductor film.

Although the crystallinity of the oxide semiconductor layer (specifically, the first oxide semiconductor layer or the second oxide semiconductor layer included in the oxide stack) has been described in detail here, since the first oxide layer and the second oxide layer provided over and under the oxide semiconductor layer are oxide layers including the same main components as the oxide semiconductor layer in the semiconductor device of one embodiment of the present invention, the first oxide layer and the second oxide layer may include a CAAC-OS film, a polycrystalline oxide semiconductor film, a microcrystalline oxide semiconductor film, an amorphous oxide semiconductor film, or a single crystal oxide semiconductor film, or a mixed film including two or more kinds of these crystal states, as in the oxide semiconductor layer.

<Formation Method of the CAAC-OS Film>

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

The flat-plate-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm Note that in the flat-plate-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

One of the conditions is increased temperature of the substrate. Specifically, the substrate temperature during the deposition is kept at a temperature higher than or equal to 100° C. and lower than or equal to 740° C., preferably higher than or equal to 200° C. and lower than or equal to 500° C. Increase in the substrate temperature during the deposition provides a following plausible mechanism for the formation of the CAAC-OS film. Specifically, when the flat-plate-like sputtered particles reach the substrate, migration occurs on the substrate surface, so that a flat plane of the sputtered particles is attached to the substrate. At this time, the sputtered particle is charged positively, whereby sputtered particles are attached to the substrate while repelling each other; thus, the sputtered particles do not overlap with each other randomly, and a CAAC-OS film with a uniform thickness can be deposited.

Second, the amount of impurities entering the CAAC-OS layer during the deposition is reduced, by which the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Finally, the proportion of oxygen in the deposition gas is increased and the power is optimized, which allows the reduction of the plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the oxygen vacancies can be reduced by heat treatment in an oxidation atmosphere. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the oxygen vacancies can be reduced by the heat treatment in an oxidation atmosphere. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

As described above, a CAAC-OS film with a total thickness of greater than or equal to 10 nm can be formed. The CAAC-OS film can be favorably used as the oxide semiconductor layer in the oxide stack.

Next, a formation method of an oxide film when the temperature of a deposition surface is low is described (for example, the temperature is lower than 130° C., lower than 100° C., lower than 70° C. or at room temperatures (20° C. to 25° C.)).

When the deposition surface has a low temperature, the sputtered particle flutters down on the deposition surface randomly. The sputtered particle does not migrate and thus is deposited at random in areas including an area where another sputtered particle 1002 is deposited, for example. In other words, the thickness of the deposited oxide layer is not uniform and the orientation of crystals is irregular. The oxide film deposited in this manner has a crystal part (nanocrystal) because the crystallinity of the sputtered particle is maintained to some degree.

In addition, when the pressure during deposition is high, the sputtered particle that is released collides with another particle (including atom, molecule, ion, radical, or the like) of argon or the like in higher frequency. The crystal structure of the sputtered particle may be broken when the sputtered particle that is released collides with another particle (the sputtered particle is re-sputtered). For example, when the sputtered particle collides with another particle, the flat-plate shape of the sputtered particle may not be able to be maintained to be broken into fragments (separated into atoms) in some cases. At this time, each atom separated from the sputtered particle is deposited on the deposition surface so that an amorphous oxide film is formed in some cases.

In addition, when a process in which a solid target is vaporized is employed instead of a sputtering method using a target having a polycrystalline oxide, the released particles are separated into atoms and are deposited on a deposition surface and thus an amorphous oxide film is formed in some cases. In addition, in a laser ablation method, atoms, molecules, ions, radicals, clusters, or the like released from a target are deposited on the deposition surface so that an amorphous oxide film is likely to be formed.

An oxide layer or an oxide semiconductor layer in any of the above crystal states may be used for the first oxide layer, the first oxide semiconductor layer, the second oxide semiconductor layer, and the second oxide layer the transistor of one embodiment of the present invention. However, it is preferable to use a CAAC-OS film as the oxide semiconductor layer functioning as a channel.

In the case of using the CAAC-OS film as the second oxide semiconductor layer, the second oxide layer provided over and in contact with the second oxide semiconductor layer tends to have a crystal structure that is grown using a crystal of the second oxide semiconductor layer as a seed crystal. Accordingly, even when the first oxide layer and the second oxide layer are formed using the same material and the same manufacturing method, the second oxide layer might have a higher crystallinity than the first oxide layer. Further, a region in contact with the second oxide semiconductor layer and a region that is not in contact with the second oxide semiconductor layer in the second oxide layer might have different crystallinities.

The structures, the methods, and the like described in this embodiment can be combined as appropriate with any of the structures, the methods, and the like described in the other embodiments.

Embodiment 4

In this embodiment, configuration examples of power converter circuits such as an inverter and an converter each including the transistor described in the above embodiment are described as an example of a semiconductor device that is one embodiment of the present invention.

[DC-DC Converter]

Figure 14A:
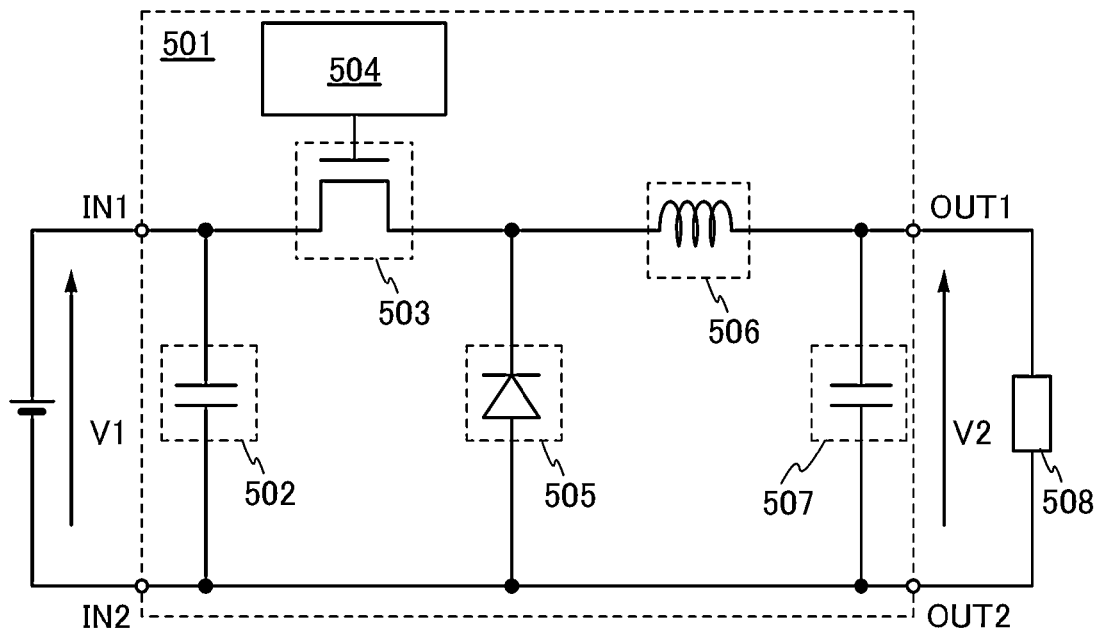
FIGS. 14A and 14B are structural examples of power converter circuits in accordance with one embodiment.

A DC-DC converter 501 in FIG. 14A is an example of a power converter and is a step-down DC-DC converter using a chopper circuit. The DC-DC converter 501 includes a capacitor 502, a transistor 503, a control circuit 504, a diode 505, a coil 506, and a capacitor 507.

The DC-DC converter 501 is operated by a switching operation of the transistor 503 with the control circuit 504. By the DC-DC converter 501, an input voltage V1 applied to input terminals IN1 and IN2 can be output from output terminals OUT1 and OUT2 to a load 508 as a voltage V2 which is stepped down. The semiconductor device described in any of the above embodiments can be applied to the transistor 503 included in the DC-DC converter 501. Therefore, a large amount of output current can flow through the DC-DC converter 501 by the switching operation, and off-state current can be reduced. Therefore, the DC-DC converter consumes less power and can operate at high speed.

Although the step-down DC-DC converter using a chopper circuit is illustrated in FIG. 14A as an example of a non-isolated power converter circuit, the semiconductor device described in any of the above embodiments can also be applied to a transistor included in a step-up DC-DC converter using a chopper circuit or a step-up/step-down DC-DC converter using a chopper circuit. Therefore, a large amount of output current can flow through the DC-DC converter by the switching operation, and off-state current can be reduced. Therefore, the DC-DC converter consumes less power and can operate at high speed.

Figure 14B:
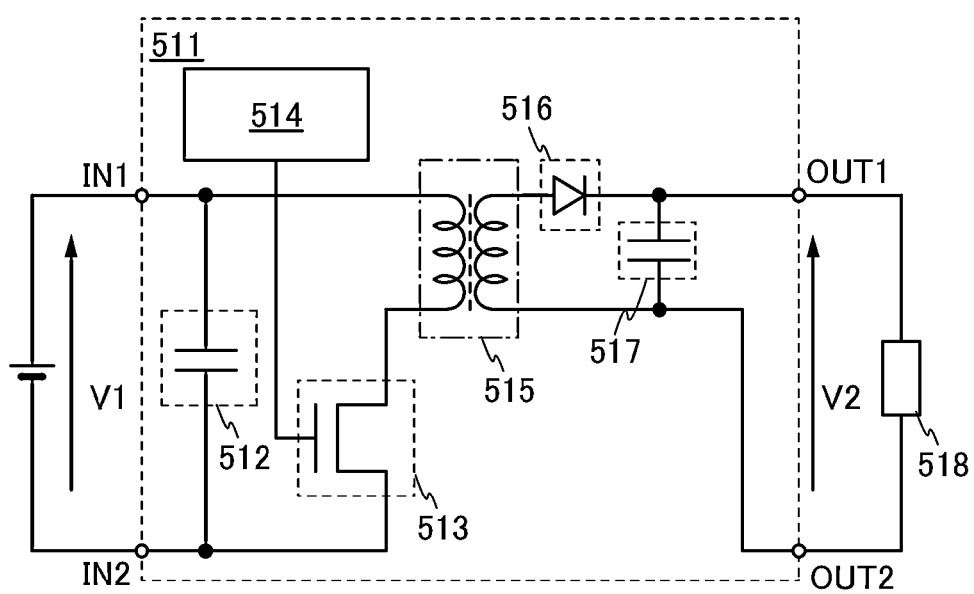

Next, a DC-DC converter 511 is illustrated in FIG. 14B as an example of a power converter, and an example of a circuit structure of a fly-back converter that is an isolated power converter circuit is shown here. The DC-DC converter 511 includes a capacitor 512, a transistor 513, a control circuit 514, a transformer 515 including a primary coil and a secondary coil, a diode 516, and a capacitor 517.

The DC-DC converter 511 in FIG. 14B is operated by a switching operation of the transistor 513 with the control circuit 514. By the DC-DC converter 511, an input voltage V1 applied to input terminals IN1 and IN2 can be output from output terminals OUT1 and OUT2 to a load 518 as a voltage V2 that is stepped up or stepped down. The semiconductor device described in any of the above embodiments can be applied to the transistor 513 included in the DC-DC converter 511. Therefore, a large amount of output current can flow through the DC-DC converter 511 by the switching operation, and off-state current can be reduced. Therefore, the DC-DC converter consumes less power and can operate at high speed.

Note that the semiconductor device described in any of the above embodiments can also be applied to a transistor included in a forward DC-DC converter.

Figure 15:
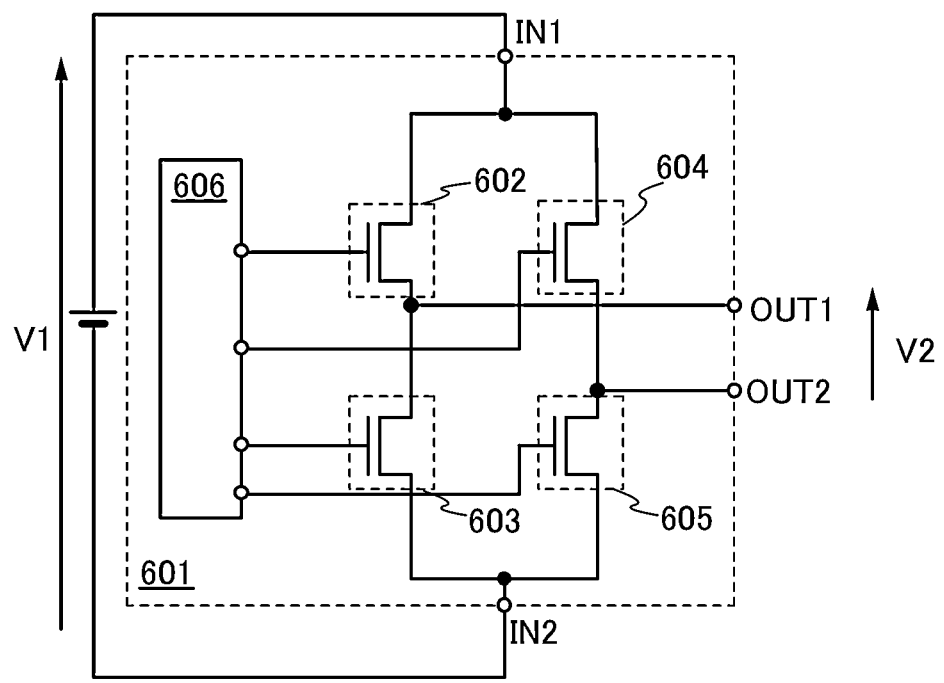
FIG. 15 is a structural example of a power converter circuit in accordance with one embodiment.

An inverter 601 in FIG. 15 is an example of a full-bridge inverter. The inverter 601 includes a transistor 602, a transistor 603, a transistor 604, a transistor 605, and a control circuit 606.

The inverter 601 in FIG. 15 is operated by a switching operation of the transistors 602 to 605 with the control circuit 606. A direct-current voltage V1 applied to input terminals IN1 and IN2 can be output from output terminals OUT1 and OUT2 as an alternating-current voltage V2. The semiconductor device described in any of the above embodiments can be used for the transistors 602 to 605 included in the inverter 601. Therefore, a large amount of output current can flow through the inverter 601 by the switching operation, and off-state current can be reduced. Therefore, the inverter consumes less power and can operate at high speed.

The structures, the methods, and the like described in this embodiment can be combined as appropriate with any of the structures, the methods, and the like described in the other embodiments.

Embodiment 5

In this embodiment, a configuration example of a power supply circuit including the transistor described in any of the above embodiments is described as an example of a semiconductor device of one embodiment of the present invention.

Figure 16:
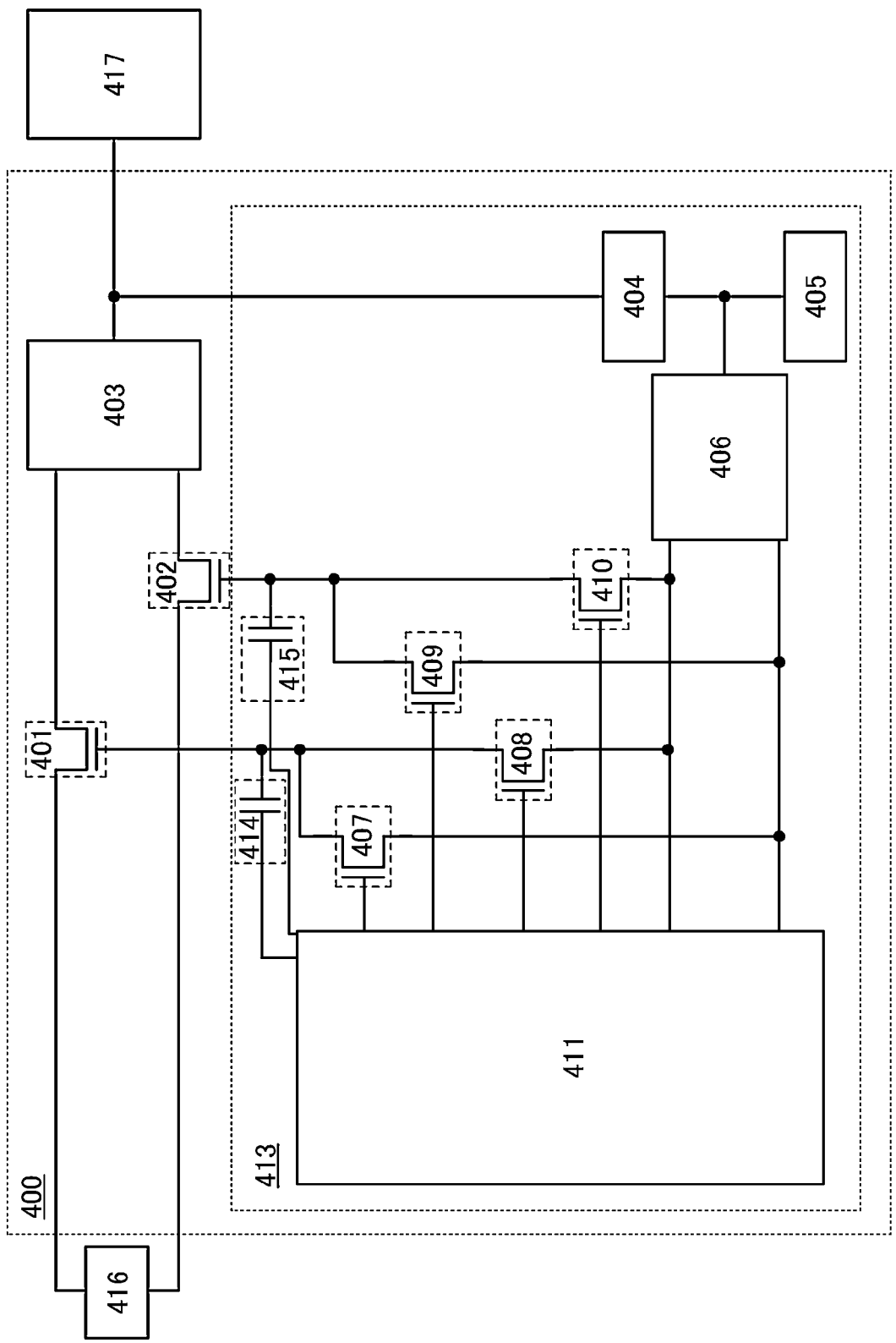
FIG. 16 is a structural example of a power supply circuit in accordance with one embodiment.

FIG. 16 illustrates a configuration example of a power supply circuit 400 of one embodiment of the present invention. The power supply circuit 400 in FIG. 16 includes a control circuit 413, a power switch 401, a power switch 402, and a voltage regulator 403.

Voltage is supplied from a power supply 416 to the power supply circuit 400. The power switches 401 and 402 each have a function of controlling input of the voltage to the voltage regulator 403.

Note that in the case where the voltage output from the power supply 416 is AC voltage, as illustrated in FIG. 16, the power switch 401 controlling input of a first potential to the voltage regulator 403 and the power switch 402 controlling input of a second potential to the voltage regulator 403 are provided in the power supply circuit 400. In the case where the voltage output from the power supply 416 is DC voltage, as illustrated in FIG. 16, the power switch 401 and the power switch 402 may be provided in the power supply circuit 400; alternatively, the second potential may be set to a ground potential, the power switch 402 is not provided, and the power switch 401 may be provided in the power supply circuit 400 instead.

In one embodiment of the present invention, a transistor having high withstand voltage is used as each of the power switches 401 and 402. For example, the transistor described in Embodiment 1 or Embodiment 2 can be used for the transistor.

When the transistors having the oxide stack are used for the power switches 401 and 402, high output current can flow through the power switches 401 and 402 and the power switches 401 and 402 can have high withstand voltage.

The use of a transistor including the oxide semiconductor in accordance with one embodiment in an active layer for the power switch 401 or 402 can achieve high-speed switching of the power switch 401 or 402, compared with a transistor including silicon carbide or gallium nitride in an active layer. Consequently, power loss due to the switching can be reduced.

The voltage regulator 403 has a function of regulating voltage input from the power supply 416 through the power switches 401 and 402. Specifically, voltage regulation in the voltage regulator 403 means any one or more of conversion of AC voltage into DC voltage, change of a voltage level, smoothing of a voltage level, and the like.

Voltage regulated in the voltage regulator 403 is applied to a load 417 and the control circuit 413.

The power supply circuit 400 in FIG. 16 includes a power storage device 404, an auxiliary power supply 405, a voltage generation circuit 406, transistors 407 to 410, and capacitors 414 and 415.

The power storage device 404 has a function of temporarily storing power supplied from the voltage regulator 403. Specifically, the power storage device 404 includes a power storage portion such as a capacitor or a secondary battery that can store power with the use of voltage applied from the voltage regulator 403.

The auxiliary power supply 405 has a function of compensating for the lack of power output from the power storage device 404 for operation of the control circuit 413. A primary battery or the like can be used as the auxiliary power supply 405.

The voltage generation circuit 406 has a function of generating voltage for controlling switching of the power switches 401 and 402 with the use of voltage output from the power storage device 404 or the auxiliary power supply 405.

Specifically, the voltage generation circuit 406 has a function of generating voltage for turning on the power switches 401 and 402 and a function of generating voltage for turning off the power switches 401 and 402.

A wireless signal input circuit 411 has a function of controlling the power switches 401 and 402 in accordance with switching of the transistors 407 to 410.

Specifically, the wireless signal input circuit 411 includes an input portion that converts an instruction superimposed on a wireless signal given from the outside to control the operating states of the power switches 401 and 402 into an electric signal, and a signal processor that decodes the instruction included in the electric signal and generates a signal for controlling the switching of the transistors 407 to 410 in accordance with the instruction.

The transistors 407 to 410 switch in accordance with the signal generated in the wireless signal input circuit 411. Specifically, when the transistors 408 and 410 are on, the voltage for turning on the power switches 401 and 402 that is generated in the voltage generation circuit 406 is applied to the power switches 401 and 402. When the transistors 408 and 410 are turned off in this state, the voltage for turning on the power switches 401 and 402 is continuously applied to the power switches 401 and 402. Further, when the transistors 407 and 409 are sequentially turned on, the voltage for turning off the power switches 401 and 402 that is generated in the voltage generation circuit 406 is applied to the power switches 401 and 402. When the transistors 407 and 409 are turned off in this state, the voltage for turning off the power switches 401 and 402 is continuously applied to the power switches 401 and 402.

In one embodiment of the present invention, a transistor with extremely low off-state current is used as each of the transistors 407 to 410 so that the operating states provided to the power switches 401 and 402 are maintained. With this structure, even when generation of the voltage for determining the operating states of the power switches 401 and 402 in the voltage generation circuit 406 is stopped, the operating states of the power switches 401 and 402 can be kept. Thus, the power consumption of the voltage generation circuit 406 is reduced, so that the power consumption of the power supply circuit 400 can be reduced.

Note that the transistors 407 to 410 may be provided with back gates and the back gates are supplied with a potential in order to control the threshold voltages of the transistors 407 to 410.

Since a transistor including the oxide semiconductor of a wide-gap semiconductor whose band gap is two or more times that of silicon in an active layer has extremely low off-state current, the transistor is preferably used as each of the transistors 407 to 410.

Among the oxide semiconductors, unlike silicon carbide or gallium nitride, an In—Ga—Zn-based oxide, an In—Sn—Zn-based oxide, or the like has an advantage of high mass productivity because a transistor with favorable electrical characteristics can be formed by sputtering or a wet process. Further, unlike silicon carbide or gallium nitride, the In—Ga—Zn-based oxide can be deposited even at room temperature; thus, a transistor with favorable electrical characteristics can be formed over a glass substrate or an integrated circuit using silicon. Further, a larger substrate can be used.

Figure 17:
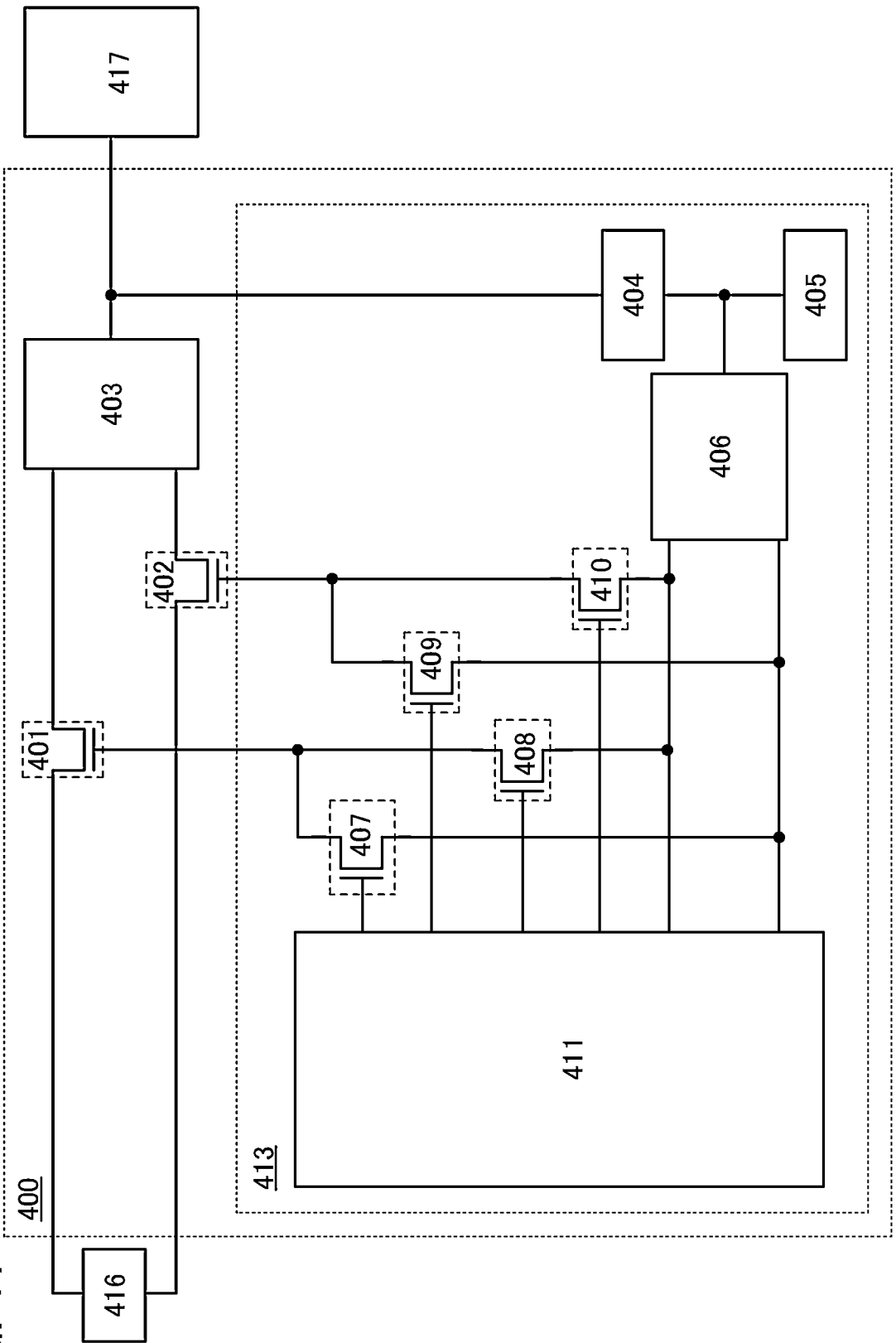
FIG. 17 is a structural example of a power supply circuit in accordance with one embodiment.

The capacitor 414 has a function of holding voltage applied to the power switch 401 when the transistors 407 and 408 are off. The capacitor 415 has a function of holding voltage applied to the power switch 402 when the transistors 409 and 410 are off. One of a pair of electrodes of each of the capacitors 414 and 415 is connected to the wireless signal input circuit 411. Note that as illustrated in FIG. 17, the capacitors 414 and 415 are not necessarily provided.

When the power switches 401 and 402 are on, voltage is supplied from the power supply 416 to the voltage regulator 403. In addition, with the voltage, power is stored in the power storage device 404.

When the power switches 401 and 402 are off, supply of voltage from the power supply 416 to the voltage regulator 403 is stopped. Thus, although power is not supplied to the power storage device 404, the control circuit 413 can be operated using power stored in the power storage device 404 or the auxiliary power supply 405 in one embodiment of the present invention, as described above. In other words, in the power supply circuit 400 according to one embodiment of the present invention, supply of voltage to the voltage regulator 403 can be stopped while the operating states of the power switches 401 and 402 are controlled by the control circuit 413. By stopping the supply of voltage to the voltage regulator 403, it is possible to prevent power consumption due to charging and discharging of the capacitance of the voltage regulator 403 when voltage is not supplied to the load 417. Consequently, the power consumption of the power supply circuit 400 can be reduced.

The structures, the methods, and the like described in this embodiment can be combined as appropriate with any of the structures, the methods, and the like described in the other embodiments.

Embodiment 6

A semiconductor device (including a power converter circuit and a power supply circuit) of one embodiment of the present invention is suitable for controlling supply of power to a device and favorably used particularly for a device that needs large power. For example, the semiconductor device can be favorably used for a device provided with a driver portion whose driving is controlled with power of a motor or the like and a device that controls heating or cooling by power, Electronic appliances in which the semiconductor device of one embodiment of the present invention can be used are display devices, personal computers, image reproducing devices provided with recording media (typically, devices which reproduce the content of recording media such as digital versatile discs (DVDs) and have displays for displaying the reproduced images), and the like. Further, as electronic appliances in which the semiconductor device of one embodiment of the present invention can be used, cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, high-frequency heating apparatuses such as microwave ovens, electric rice cookers, electric washing machines, electric fans, driers, air-conditioning systems such as air conditioners, raising and lowering devices such as elevators and escalators, electric refrigerators, electric freezers, electric refrigerator-freezers, electric sewing machines, electric tools, semiconductor testing devices, and the like can be given. The semiconductor device of one embodiment of the present invention may be used for a moving object powered by an electric motor. The moving object is a motor vehicle (a motorcycle or an ordinary motor vehicle with three or more wheels), a motor-assisted bicycle including an electric bicycle, an air-plane, a vessel, a rail car, or the like. Further, the semiconductor device can be used for controlling driving of industrial robots used in a variety of fields, e.g., industries of food, home electric appliances, the moving objects, steel, semiconductor devices, civil engineering, architecture, and construction.

Specific examples of these electronic appliances are illustrated in FIGS. 18A to 18D.

Figure 18A:
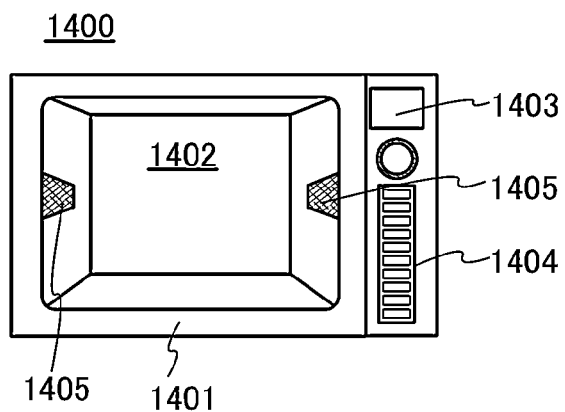
FIGS. 18A to 18D each illustrate an electronic appliance in accordance with one embodiment.

FIG. 18A illustrates a microwave oven 1400, which includes a housing 1401, a treatment room 1402 where an object is placed, a display portion 1403, an input device (e.g., an operating panel) 1404, and an irradiation portion 1405 supplying an electromagnetic wave generated from a high-frequency wave generator provided in the housing 1401 to the treatment room 1402.

The semiconductor device of one embodiment of the present invention can be used, for example, in a power supply circuit that controls supply of power to the high-frequency wave generator.

Figure 18B:
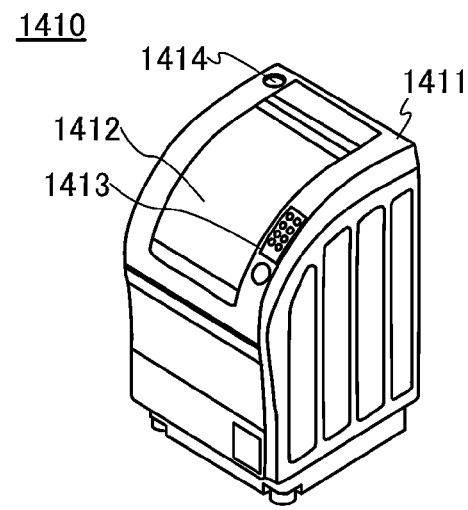

FIG. 18B illustrates a washing machine 1410, which includes a housing 1411, an open/close portion 1412 for a washing tub provided in the housing 1411, an input device (e.g., an operating panel) 1413, and a water inlet 1414 of the washing tub.

The semiconductor device of one embodiment of the present invention can be used, for example, in a circuit that controls supply of power to a motor controlling rotation of the washing tub.

Figure 18C:
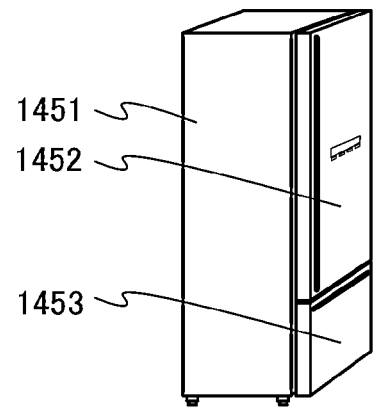

FIG. 18C is an example of an electric refrigerator-freezer. The electronic appliance illustrated in FIG. 18C includes a housing 1451, a refrigerator door 1452, and a freezer door 1453.

In the electronic appliance illustrated in FIG. 18C, the semiconductor device that is one embodiment of the present invention is provided inside the housing 1451. With this structure, supply of a power voltage to the semiconductor device in the housing 1451 can be controlled in accordance with the temperature inside the housing 1451 or in response to opening and closing of the refrigerator door 1452 and the freezer door 1453, for example.

Figure 18D:
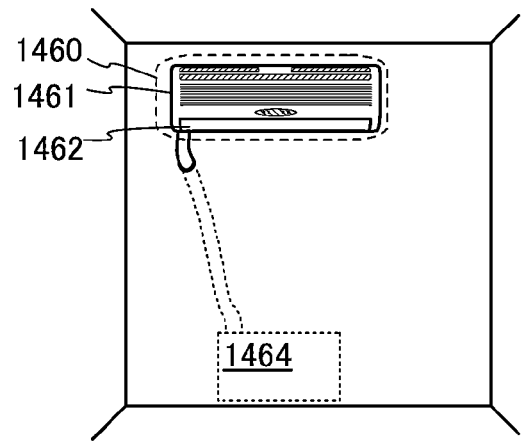

FIG. 18D illustrates an example of an air conditioner. The electronic appliance illustrated in FIG. 18D includes an indoor unit 1460 and an outdoor unit 1464.

The indoor unit 1460 includes a housing 1461 and a ventilation duct 1462.

In the electronic appliance illustrated in FIG. 18D, the semiconductor device that is one embodiment of the present invention is provided inside the housing 1461. With this structure, supply of a power supply voltage to the semiconductor device in the housing 1461 can be controlled in response to a signal from a remote controller or in accordance with the indoor temperature or humidity, for example.

The semiconductor device of one embodiment of the present invention can be used, for example, in a circuit that controls supply of power to a motor controlling rotation of a fan included in the outdoor unit 1464.

Note that the split-system air conditioner including the indoor unit and the outdoor unit is shown in FIG. 18D as an example; alternatively, an air conditioner may be such that the functions of an indoor unit and an outdoor unit are integrated in one housing.

The structures, the methods, and the like described in this embodiment can be combined as appropriate with any of the structures, the methods, and the like described in the other embodiments.

Example

In this example, the band structure of an oxide stack was examined.

[Energy Gap]

First, samples were formed in such a manner that ions were implanted to oxide semiconductor layers under different conditions, and the energy gap in each sample was measured.

[Formation of Sample]

A quartz substrate was used as a substrate of each sample. An oxide semiconductor layer having a thickness of about 100 nm was deposited over the surface of the substrate. The oxide semiconductor layer was deposited by a sputtering method using a polycrystalline sputtering target having an atomic ratio of In:Ga:Zn=1:1:1.

Then, phosphorus was implanted to the oxide semiconductor layer by an ion implantation method. The following conditions were used for the implantation of phosphorus: three conditions of the accelerating voltage, i.e., 10 kV, 20 kV, and 30 kV were used; and seven conditions of the dosage of phosphorus, i.e., $1\times10^{12}$ cm$^{-2}$, $1\times10^{13}$ cm$^{-2}$, $1\times10^{14}$ cm$^{-2}$, $5\times10^{14}$ cm$^{-2}$, $1\times10^{15}$ cm$^{-2}$, $3\times10^{15}$ cm$^{-2}$, and $5\times10^{15}$ cm$^{-2}$ were used.

[Evaluation by Ellipsometry]

The band gap of each of the formed samples was obtained by ellipsometry. Here, as the oxide semiconductor layer, a stacked-layer structure in which a first layer (L1) that was not doped with phosphorus and a second layer (L2) that was doped with phosphorus were stacked from the substrate side is assumed. The relationships between the condition of ion implantation and the thickness of the second layer (L2) are shown in graphs in the upper section of FIG. 19 and the relationships between the condition of ion implantation and the band gap of the second layer (L2) are shown in graphs in the lower section of FIG. 19.

Figure 19:
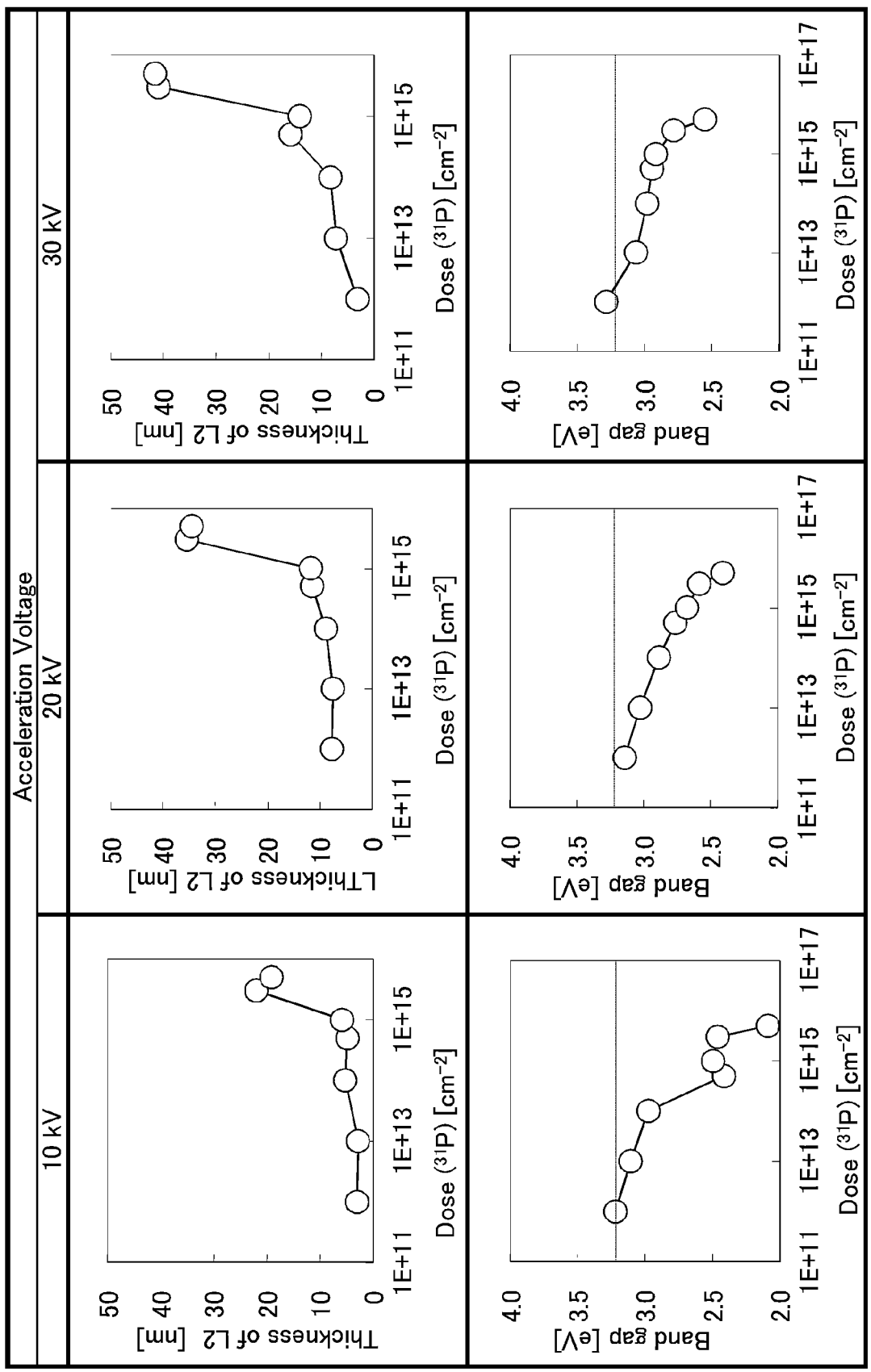
FIG. 19 is graphs each showing relationship the depth of a low-resistant region and a band gap of the oxide semiconductor films with respect to the acceleration voltage and the dose amount of phosphorus in Example.

A dashed line in each graph in the lower section of FIG. 19 denotes the band gap (3.22 eV) in the sample that is not doped with phosphorus.

The graphs in the upper section of FIG. 19 show that as the accelerating voltage is increased and the amount of implanted ions is increased, a region whose resistance is reduced by the doping with phosphorus tends to expand in the depth direction.

The graphs in the lower section of FIG. 19 show that as the amount of implanted ions is increased, the band gap tends to be reduced. Further, it is found that as the accelerating voltage is reduced, distribution in the depth direction is reduced, and as a result, the change in band gap with respect to the amount of implanted ions tends to increase.

[Band Structure]

A sample different from those described above was formed and evaluated by ultraviolet photoemission spectroscopy (UPS).

[Formation of Sample]

A silicon wafer was used as a substrate of the sample. First, an oxide film on the silicon substrate was removed by dilute hydrofluoric acid, and then a first oxide layer having a thickness of about 10 nm and a first oxide semiconductor layer having a thickness of about 25 nm were successively deposited over the silicon substrate. The first oxide layer was deposited by a sputtering method using a polycrystalline sputtering target having an atomic ratio of In:Ga:Zn=1:3:2. The deposition of the first oxide semiconductor layer was performed in a manner similar to that described above. That is, over the first oxide layer was formed the first oxide semiconductor layer by a sputtering method using a polycrystalline sputtering target of In:Ga:Zn=1:1:1 at a thickness of approximately 100 nm.

Next, phosphorus was implanted to the first oxide semiconductor layer by an ion implantation method. The conditions of the implantation of phosphorus were as follows: the accelerating voltage was 10 kV; and the dosage of phosphorus was $1\times10^{14}$ cm$^{-2}$.

Next, a second oxide semiconductor layer having a thickness of about 10 nm and a second oxide layer having a thickness of about 10 nm were successively deposited. The second oxide semiconductor layer was deposited in a manner similar to that of the first oxide semiconductor layer, and the second oxide layer was deposited in a manner similar to that of the first oxide layer.

[Evaluation using UPS]

An energy difference between the vacuum level and the top of the valence band (the energy difference is also referred to as an ionization potential) in the formed sample was measured using UPS. In the measurement, distribution of the ionization potential in the depth direction was examined while the sample was etched from its surface by a sputtering method.

Figure 20:
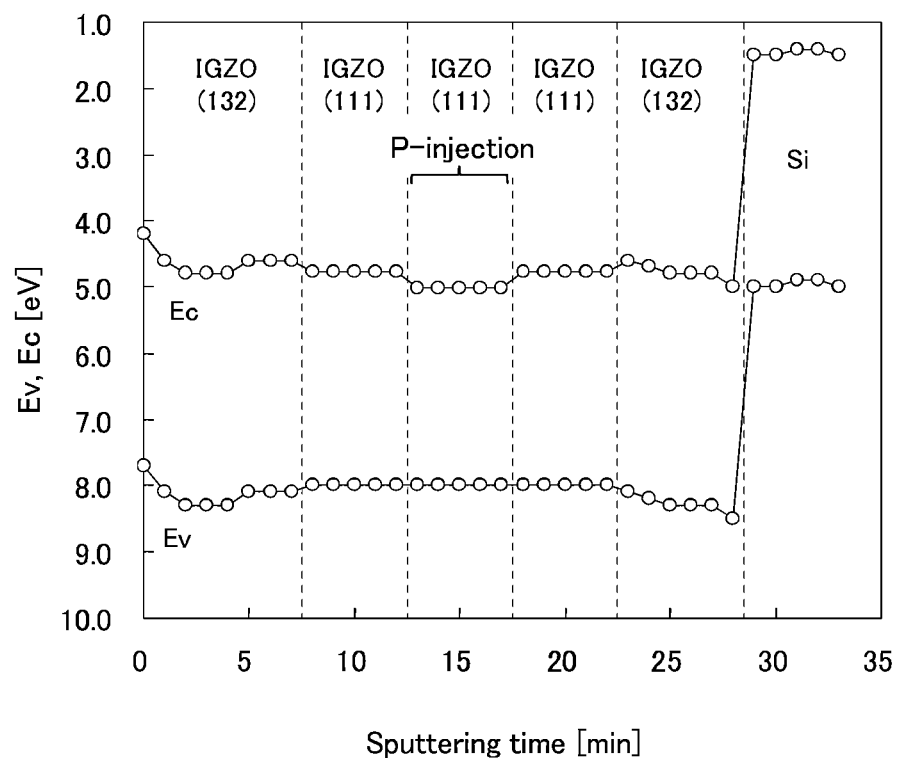
FIG. 20 is a graph showing a band structure in Example.

FIG. 20 shows an energy difference (Ev) between the vacuum level and the top of the valence band versus the sputtering time, which was obtained by UPS. Dashed lines in FIG. 20 each denote the interface between layers estimated from the value of Ev. The sputtering time corresponds to the thickness of the oxide stack.

Further, FIG. 20 shows an energy difference (Ec) between the vacuum level and the bottom of the conduction band, which was calculated using the above described Ev and value of the band gap obtained by ellipsometry. Here, the band gap of a layer deposited using a polycrystalline sputtering target having an atomic ratio of In:Ga:Zn=1:1:1 (the layer is represented as IGZO(111)) was 3.22 eV, and the band gap of a layer deposited using a polycrystalline sputtering target having an atomic ratio of In:Ga:Zn=1:3:2 (the layer is represented as IGZO(132)) was 3.50 eV.

As shown in FIG. 20, the energy difference Ev is a substantially constant value (about 8.0 eV) regardless of the doping of phosphorus.

Further, as shown in FIG. 20, IGZO(132) has the smallest energy difference Ec and IGZO(111) has the secondary smallest energy difference Ec, while the IGZO(111) to which phosphorus was implanted has the largest energy difference Ec. The difference in Ec between IGZO(132) and IGZO(111) was about 0.28 eV, and the difference in Ec between IGZO (111) and IGZO(111) to which phosphorus was implanted was about 0.24 eV.

The above results indicate that the oxide stack of one embodiment of the present invention has two-stage well.

This application is based on Japanese Patent Application serial no. 2013-037673 filed with Japan Patent Office on Feb. 27, 2013, the entire contents of which are hereby incorporated by reference.

What is claimed is:

1. A semiconductor device comprising:
a transistor which includes:
a first oxide layer;
a first oxide semiconductor layer over and in contact with the first oxide layer, the first oxide semiconductor layer including a first region containing an impurity;
a second oxide semiconductor layer over and in contact with the first region; and
a second oxide layer over and in contact with the second oxide semiconductor layer,
wherein each of the first oxide semiconductor layer and the second oxide semiconductor layer is a crystalline oxide semiconductor layer.

2. The semiconductor device according to claim 1, wherein the first oxide layer and the first oxide semiconductor layer comprise a common metal element selected from indium and zinc.

3. The semiconductor device according to claim 1, wherein the first oxide semiconductor layer and the second oxide semiconductor layer comprise a common metal element selected from indium and zinc at different proportions.

4. The semiconductor device according to claim 1, wherein the second oxide layer and the second oxide semiconductor layer comprise a common metal element selected from indium and zinc.

5. The semiconductor device according to claim 1, wherein the impurity is selected from carbon, phosphorus, arsenic, antimony, boron, aluminum, nitrogen, argon, helium, neon, fluorine, chlorine, hydrogen, and titanium.

6. A semiconductor device comprising:
a first oxide layer;
a first oxide semiconductor layer over and in contact with the first oxide layer, the first oxide semiconductor layer including a first region containing an impurity;
a second oxide semiconductor layer over and in contact with the first region;
a second oxide layer over and in contact with the second oxide semiconductor layer;
a source electrode layer and a drain electrode layer over the second oxide semiconductor layer;
a gate insulating layer over the second oxide layer, the source electrode layer, and the drain electrode layer, the gate insulating layer being in contact with the second oxide layer; and
a gate electrode over the gate insulating layer.

7. The semiconductor device according to claim 6, wherein the source electrode layer and the drain electrode layer are located over and in contact with the second oxide layer.

8. The semiconductor device according to claim 6, wherein the gate insulating layer is in contact with the source electrode layer and the drain electrode layer.

9. The semiconductor device according to claim 6, wherein the second oxide layer is covered by the source electrode layer and the drain electrode layer.

10. The semiconductor device according to claim 6, wherein the source electrode layer and the drain electrode layer are covered by the second oxide layer.

11. The semiconductor device according to claim 6, wherein a side surface of the first oxide semiconductor layer is fully covered by the second oxide semiconductor layer.

12. The semiconductor device according to claim 6, wherein the first oxide semiconductor layer is capsuled by the first oxide layer and the second oxide semiconductor layer.

13. The semiconductor device according to claim 6, wherein a side surface of the first oxide layer is fully covered by the second oxide semiconductor layer.

14. The semiconductor device according to claim 6, wherein the second oxide semiconductor layer is in contact with a top surface of the first oxide layer.

15. The semiconductor device according to claim 6, wherein the first oxide semiconductor layer and the second oxide semiconductor layer are capsuled by the first oxide layer and the second oxide layer.

16. The semiconductor device according to claim 6, wherein a side surface of the second oxide layer is coplanar with a side surface of the gate insulating layer.

17. The semiconductor device according to claim 6,
wherein a side surface of the second oxide layer is coplanar with a side surface of the gate electrode.

18. The semiconductor device according to claim 6,
wherein the gate electrode is offset in a channel length direction with respect to the first region.

19. The semiconductor device according to claim 6,
wherein the first oxide layer and the first oxide semiconductor layer comprise a common metal element selected from indium and zinc.

20. The semiconductor device according to claim 6,
wherein the first oxide semiconductor layer and the second oxide semiconductor layer comprise a common metal element selected from indium and zinc at different proportions.

21. The semiconductor device according to claim 6,
wherein the second oxide layer and the second oxide semiconductor layer comprise a common metal element selected from indium and zinc.

22. The semiconductor device according to claim 6,
wherein the impurity is selected from carbon, phosphorus, arsenic, antimony, boron, aluminum, nitrogen, argon, helium, neon, fluorine, chlorine, hydrogen, and titanium.

23. A semiconductor device comprising:
a first oxide layer;
a first oxide semiconductor layer over and in contact with the first oxide layer, the first oxide semiconductor layer including a first region including an impurity and a second region in which the first region is embedded;
a second oxide semiconductor layer over and in contact with the first region and the second region;
a second oxide layer over and in contact with the second oxide semiconductor layer;
a source electrode layer and a drain electrode layer over the second oxide semiconductor layer;
a gate insulating layer over the second oxide layer, the source electrode layer, and the drain electrode layer, the gate insulating layer being in contact with the second oxide layer; and
a gate electrode over the gate insulating layer,
wherein the second region overlaps with at least one of the source electrode layer and the drain electrode layer, and
wherein the first region is positioned between the source electrode layer and the drain electrode layer.

24. The semiconductor device according to claim 23,
wherein a side surface of the first oxide semiconductor layer is coplanar with a side surface of the first oxide layer.

25. The semiconductor device according to claim 23,
wherein a side surface of the first oxide semiconductor layer is coplanar with a side surface of the second oxide semiconductor layer.

26. The semiconductor device according to claim 23,
wherein a side surface of the second oxide semiconductor layer is coplanar with a side surface of the second oxide layer.

27. The semiconductor device according to claim 23,
wherein the source electrode layer and the drain electrode layer are located over and in contact with the second oxide layer.

28. The semiconductor device according to claim 23,
wherein the gate insulating layer is in contact with the source electrode layer and the drain electrode layer.

29. The semiconductor device according to claim 23,
wherein the second oxide layer is covered by the source electrode layer and the drain electrode layer.

30. The semiconductor device according to claim 23,
wherein the source electrode layer and the drain electrode layer are covered by the second oxide layer.

31. The semiconductor device according to claim 23,
wherein a side surface of the second oxide layer is coplanar with a side surface of the gate insulating layer.

32. The semiconductor device according to claim 23,
wherein a side surface of the second oxide layer is coplanar with a side surface of the gate electrode.

33. The semiconductor device according to claim 23,
wherein the gate electrode is offset in a channel length direction with respect to the first region.

34. The semiconductor device according to claim 23,
wherein the first oxide layer and the first oxide semiconductor layer comprise a common metal element selected from indium and zinc.

35. The semiconductor device according to claim 23,
wherein the first oxide semiconductor layer and the second oxide semiconductor layer comprise a common metal element selected from indium and zinc at different proportions.

36. The semiconductor device according to claim 23,
wherein the second oxide layer and the second oxide semiconductor layer comprise a common metal element selected from indium and zinc.

37. The semiconductor device according to claim 23,
wherein the impurity is selected from carbon, phosphorus, arsenic, antimony, boron, aluminum, nitrogen, argon, helium, neon, fluorine, chlorine, hydrogen, and titanium.

* * * * *